(12) United States Patent
Yamazaki et al.

(10) Patent No.: US 6,703,705 B2
(45) Date of Patent: Mar. 9, 2004

(54) SEMICONDUCTOR DEVICE AND METHOD FOR PACKAGING SAME

(75) Inventors: Takao Yamazaki, Tokyo (JP); Toru Mori, Tokyo (JP); Akinobu Shibuya, Tokyo (JP); Shintaro Yamamichi, Tokyo (JP); Yuzo Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 129 days.

(21) Appl. No.: 09/996,054

(22) Filed: Nov. 28, 2001

(65) Prior Publication Data

US 2002/0074643 A1 Jun. 20, 2002

(30) Foreign Application Priority Data

Nov. 28, 2000 (JP) .................................. 2000-360853

(51) Int. Cl.[7] .............................................. H01L 23/52
(52) U.S. Cl. .................. 257/692; 257/691; 257/778; 257/303; 257/758; 257/700; 257/532; 257/738
(58) Field of Search .................. 257/528, 532, 257/534, 774, 738, 737, 700, 701, 758, 759, 760, 288, 395, 535, 310, 296, 303, 516, 595, 602

(56) References Cited

U.S. PATENT DOCUMENTS 5,089,878 A * 2/1992 Lee .............................. 257/664
5,099,306 A * 3/1992 Dunaway et al. ............ 257/666

FOREIGN PATENT DOCUMENTS

JP 08017960 1/1996

OTHER PUBLICATIONS

"Think Film Integrated Decoupling Capacitor With Redundancy", Apr. 1, 1985, IBM Technical Disclosure Bulletin Apr. 1985, vol. 27 Issue No. 11, pp. 6791–6763.*

"Directly Attached Decoupling Capacitors and Fabrication Process", Nov. 1, 1989, IBM Technical Disclosure Nov. 1989, vol. 32 Issue No. 6B, pp. 330–331.*

* cited by examiner

*Primary Examiner*—Nathan J. Flynn
*Assistant Examiner*—Pershelle Greene
(74) *Attorney, Agent, or Firm*—Katten Muchin Zavis Rosenman

(57) ABSTRACT

A semiconductor device has an LSI device provided with a plurality of power supply line connection pads and ground line connection pad in a peripheral edge part of a circuit-formation surface, metal foil leads 5 electrically connected to each of the pads and adhered to the LSI device via an insulation layer, and decoupling capacitors mounted on one surface of the metal foil leads.

19 Claims, 14 Drawing Sheets

SEMICONDUCTOR DEVICE AND METHOD FOR PACKAGING SAME

BACKGROUND OF THE INVENTION

1. Field of the Invention

The present invention relates to a semiconductor device having a decoupling capacitor which suppresses or compensates a momentary drop in direct current voltage occurring at the time of a load variation in an LSI device operating at a high speed.

2. Related Art

FIG. 24 of the accompanying drawings shows a variation ($\Delta V$) in the DC voltage V supplied to an LSI device 104 in the case in which the LSI device 104, which performs high-speed switching with a rise time of $t_1$, is mounted to a circuit board 111. In FIG. 24, there is no decoupling capacitor mounted, which suppresses or compensates for a voltage variation $\Delta V$ in the DC voltage supplied to the circuit board 111. The reference numeral 101 in FIG. 24 denotes a power supply line, 102 is a signal line, 103 is a ground line, 105 is a DC power supply, and 106 are vias and through holes. FIG. 25 is the equivalent circuit of FIG. 24. When the LSI device 104 is switched at a high speed, the wiring between the DC power supply 105 and the LSI device 104, or the parasitic inductance L (L1+L2+L3+L4+L5+L6) 108 existing in the vias or through holes 106 cause a variation in the DC voltage V supplied to the LSI device 104. When this occurs, the amount of variation $\Delta V$ (voltage drop) in the DC voltage is given by the equation (1).

$$\Delta V = R \times \Delta i + L \times di/dt \quad (1)$$

In the above, R is the resistance and L is the inductance of the wiring and the capacitor, and $\Delta i$ is the current variation over the time $\Delta t$.

Therefore, the larger are the resistance R, the wire, the parasitic inductance L 108 existing in the via or through hole, or the load variation di, or the smaller is the variation time dt, the greater will be the increase in the voltage variation $\Delta V$. In recent years, LSI device is driven at high frequency the clock rates of which having come to exceed several hundred megahertz. The rise time $t_r$ of a pulse waveform in a digital circuit is thus equivalent to the load variation time dt. The faster is the clock frequency, the shorter is the rise time $t_r$, so that the greater is the amount of voltage variation $\Delta V$. In addition to this effect, recent years have seen advancements in the reduction of the input voltage V in order to achieve LSI devices that operate at high speeds (for example, reduction from 3.3 V to 1.8 V), and there is a trend toward even greater increases in the voltage variation rate ($\Delta V/V$), so that the value of $\Delta V/v$ exceeds the allowable value for an LSI device (approximately 5%). While no problem would arise if a switching power supply were to be able to compensate for this voltage variation, because a switching power supply requires from 100 ns to several $\mu s$ of time in order to perform compensation, it cannot track the voltage variations encountered in an LSI device that is switched at a high speed (several hundred ps to 1 ns).

In order to prevent misoperation in a LSI device such as this caused by voltage variations, in the past a capacitor was connected in parallel between the power supply line and the ground line, this capacitor generally being referred to as a decoupling capacitor. A decoupling capacitor has two effects, the effect of bypassing a high-speed switching signal generated from the LSI device, shortening the path of a high-speed signal, and reducing the parasitic inductance (which will be referred to as the first effect hereinafter), and the effect of supplying the load from the decoupling capacitor (that is, discharging thereinto) so as to compensate for the voltage drop occurring temporarily when performing high-speed switching (which will be referred to as the second effect hereinafter). In accordance with Equation (1), in order to make $\Delta V$ small, the inductance L (in, for example, the wiring and the via and through holes) can be minimized, and recently in order to minimize this inductance, as shown in FIG. 26, a decoupling capacitor 109 is mounted directly to the side of the LSI device 104, or directly below the LSI device 104 via the intervening circuit board 111. FIG. 27 shows the equivalent circuit for this arrangement. By virtue of the first and second effects achieved by the decoupling capacitor, the amount of variation $\Delta V$ in the DC voltage supplied to the LSI device is reduced, as shown by the broken lines in the graph at the upper part of FIG. 27.

The main cause of an increase in the variation of the DC voltage supplied to an LSI device that switches at a high speed is parasitic inductance L existing in the wiring path between the LSI device and the decoupling capacitor. This parasitic inductance L is the parasitic inductance existing in wiring, a via hole, and a through hole. The parasitic inductance of the decoupling capacitor itself is yet another cause of voltage variation. In order to reduce the parasitic inductance of wiring, a via hole, and a through hole, it is necessary to make the lengths thereof be as small as possible. However, with a capacitor mounted in the vicinity of an LSI device, because there is a parasitic inductance of approximately 100 pH/mm in wiring, vias, and through holes, if we consider wiring lengths and the sizes of vias and through holes in the past, there would be a parasitic inductance of approximately 300 pH. Additionally, it is not possible to ignore the parasitic inductance of the decoupling capacitor itself (which, in the past, has been approximately 1 nH for each chip capacitor, so that if N capacitors are connected in parallel, the total effective parasitic inductance would be 1 nH/N). Because of the existence of these parasitic inductances, if we consider the case of a DC supply voltage of 1.8 V and high-speed switching equivalent to 500 MHz, the voltage variation rate $\Delta V/v$ would be at least approximately 10 to 15%, this representing the cause of misoperation of the LSI device.

Additionally, in the past the resonant frequency of a decoupling capacitor was low, this being in the range from several tens of MHz to 80 MHz, there was the problem that the decoupling capacitor failed to function effectively as a decoupling capacitor when the LSI device clock frequency reached over several hundred MHz, so that there was a need to make the resonant frequency of the decoupling capacitor itself higher (because a high-speed signal of a frequency higher than the resonant frequency of the decoupling capacitor resulted in a lag that prevented the proper tracking for load compensation, thereby making it impossible to effectively suppress voltage variation). In order to achieve a high resonant frequency in a capacitor, it is necessary to reduce the parasitic inductance of the decoupling capacitor itself, making it necessary to take measures with regard to such structural features as the shape of the capacitor electrodes and the electrolytic thickness and the like. According to Nikkei Electronics (Apr. 19, 1999 edition), pp. 144–156, it is known that reducing the electrolytic thickness reduces the parasitic inductance, and an invention related to a semiconductor device using a thin-film capacitor has been reported (for example, in Japanese unexamined patent publications (KOKAI) No. 11-458822 and 8-97360).

If we take the case of an LSI device (A) having a clock frequency $f_H$ of 100 MHz, a maximum current consumption I of 10 A, and a power supply voltage V of 3.3 V, and an LSI device (B) for which $f_H$=500 MHz, I=90 A and V=1.8 V, if a calculation is performed of the capacitance C of a decoupling capacitor required to compensate for the voltage drop ΔV (assumed to be 10% of the rated voltage) during one clock cycle, because the electrical charge Q required to compensate for the voltage drop is Q=C×ΔV=I×(1/$f_H$), from the relationship of $$C=I/(f_H \times \Delta V) \quad (2)$$

the required capacitance C in the case of the LSI device (A) would be 10 A/(100×10⁶×3.3×0.1)=0.30 μF, while in the case of the LSI device (B), the required capacitance C would be 90 A/(500×10⁶×1.8×0.1)=1.0 μF. Thus, if the LSI device clock speed increases and also the power consumption becomes large, the capacitance required for the decoupling capacitor becomes larger.

For a given decoupling capacitor parasitic inductance, however, if the capacitance increases the LC resonant frequency (f=1/(2 δLC) is reduced, there arises the problem that it is not possible to sufficiently supply the load within the time that the voltage drop occurs (that is, within the time between the rise and fall of the clock). This being the case, with the increasing speeds of LSI devices, it has become necessary to reduce the parasitic inductances of decoupling capacitor themselves. For example, in the case of a clock signal at 500 MHz, with a capacitor having a capacitance of 1.0 μF, if the resonant frequency is to be pushed higher than 500 MHz, it is necessary that the parasitic inductance be reduced to below 0.1 pH. Because this is not possible with a single capacitor, in practice this is done, for example, by connecting in parallel 100 low-capacitance/low-inductance decoupling capacitors, each having a capacitance C of 10 nF or less and an inductance (L) of 10 pH or less, between the power supply and ground. Because any reduction in the parasitic inductance of the decoupling capacitor results in a higher LC resonant frequency, to make up for the accompanying individual reduction in capacitance, it is necessary to mount a large number of capacitors in parallel. If 100 or more capacitors are mounted, mounting space for the capacitors and the associated wiring is required, thereby hindering the achievement of a small circuit board.

Accordingly, in order to solve the problems of the drawbacks in the conventional technology, as noted above, it is an object of the present invention to provide a semiconductor device having a decoupling capacitor that suppresses or compensates for a momentary drop in the DC voltage supplied to an LSI device operating at a high speed. It is a further object of the present invention to reduce the variation in the DC voltage supplied to the LSI device while reducing the size of the circuit board.

SUMMARY OF THE INVENTION

In order to achieve the above-noted objects, the present invention adopts the following basic technical constitution.

Specifically, a semiconductor device according to the present invention has a main semiconductor device having on a circuit-formation surface thereof a plurality of power supply line connection pads and a plurality of ground line connection pads, conductors each being electrically connected to the power supply connection pads and the ground line connection pads, respectively, and capacitors electrically connected to at least one surface of the conductors. In particular, the capacitor function as decoupling capacitors that suppress or compensate for a momentary drop in the DC voltage supplied to the main semiconductor device.

In a semiconductor device according to the present invention, rather than mounting capacitors on the circuit board as done in the past, the capacitors are mounted directly to the conductors connected to either one of the power supply line connection pads and the ground line connection pads (possibly positioned over the main semiconductor device), thereby making the length of wiring between the main semiconductor device and the decoupling capacitors extremely short, for example less than 1 mm, making it possible to sufficiently reduce the parasitic inductance of the wiring paths. As a result, the decoupling capacitors function sufficiently, and it is possible to effectively suppress or compensate for a momentary drop in the DC voltage. Additionally, by mounting the capacitor directly on the conductor, it is possible to achieve a reduction in the mounting space for the capacitors on the semiconductor device, and thereby to achieve a reduction in the size of a circuit board to which the semiconductor device is mounted.

It is desirable that the power supply line connection pads and the ground line connection pads are alternately disposed along the edge extension direction on the peripheral edge of the circuit-formation surface of the main semiconductor device, and that a decoupling capacitor be provided between two neighboring conductors each connected respectively to a power supply line connection pad and a ground line connection pad.

According to this arrangement, because it is possible to connect many decoupling capacitors to one main semiconductor device, by enabling the mounting of a large number of low-inductance capacitors, it is not only possible to reduce the parasitic inductance of the decoupling capacitors themselves, but also possible to achieve an overall large capacitance, and to achieve a high LC resonant frequency.

It is possible to bend the above-noted conductor from the circuit-formation surface side to a side surface, and to provide decoupling capacitors on at least one side of this part. Additionally, it is possible to cause it to further bend from a side surface to the rear surface thereof, and to provide decoupling capacitors on at least one side of this part.

According to the above arrangement, in addition to be able to mount a large number of capacitors to a single main semiconductor device, because the surface area occupied by the capacitors does not increase much relative to the number of capacitors mounted, it is possible to achieve a further reduction in the size of a circuit board to which this semiconductor device is mounted.

When joining the power supply line connection pads or the ground line connection pads of the main semiconductor device to the conductors, it is possible to use solder or a gold bump. By doing this, it is possible to facilitate the making of electrical connections between the power supply line connection pads or the ground line connection pads and the conductors.

Regarding the conductors, the following two forms of conductors can be envisioned. In one, a flexible substrate is used which includes metal foil leads that serve as conductors. Specifically, a flexible substrate is used which has metal foil leads that serve as conductors and an insulation layer minimally provided on a surface of the metal foil leads opposing can be contacted to the circuit-formation surface of the main semiconductor device. In this case, if a thermoplastic adhesive is used as the insulation layer, it is possible to fix the flexible substrate to the main semiconductor device using a simple method.

More specifically, the metal foil leads are formed on only the peripheral edge part of the circuit-formation surface of the main semiconductor device, a plurality of holes are provided on the insulation layer provided in a region formed on the circuit-formation surface of the main semiconductor device, and in the region, no metal foil lead is provided, and at positions corresponding to the plurality of pads of the main semiconductor device, and a plurality of bumps of the main semiconductor device are caused to pass through each of the plurality of holes, thereby making joints to each of the plurality of pads.

Another form is one in which a lead frame having metal foil leads serving as conductors is used. Specifically, a lead frame is used provided with an insulation layer on at least a surface opposing the main semiconductor device, this lead frame being joinable to the circuit-formation surface of the main semiconductor device. In this case, if a thermoplastic adhesive is used as the insulation layer, it is possible to fix the lead frame to the main semiconductor device using a simple method.

It is desirable that a chip capacitor, such as a laminated ceramic capacitor, a tantalum capacitor, an aluminum electrolytic capacitor, or an organic capacitor be used as the decoupling capacitors.

Another form of the present invention is a method for mounting a semiconductor device, this method having a step of fabricating a main semiconductor device in which the power supply line connection pads and the ground line connection pads are alternately placed on and along the peripheral edge of the circuit-formation surface of a main semiconductor device, and in which bumps are formed over pads in regions other than the peripheral edge part of the circuit-formation surface, a step of fabricating a flexible substrate joining a capacitor between two neighboring metal foil leads, a step of fabricating the above-noted semiconductor device by making electrical connections between the power supply line connection pads and the ground line connection pads at the peripheral edge part of the main semiconductor device and the metal foil leads of the flexible substrate, and a step of mounting the semiconductor device onto the circuit board by placing the semiconductor device on the circuit board and heating it, so as to cause the bumps of the main semiconductor device to reflow.

The above-noted method for mounting a semiconductor device uses the above-noted flexible substrate. According to this method, the handling of the main semiconductor device and the conductors when making electrical connections is facilitated, thereby improving the ease of device mounting.

Yet another form of the present invention is a method for mounting a semiconductor device, this method having a step of fabricating a main semiconductor device in which the power supply line connection pads and the ground line connection pads are alternately placed on and along the peripheral edge of the circuit-formation surface of a main semiconductor device, and in which bumps are formed over pads in regions other than the peripheral edge part of the circuit-formation surface, a step of fabricating a lead frame with joining a capacitor between two conductors, a step of fabricating the above-noted semiconductor device by making electrical connections between the power supply line connection pads and the ground line connection pads formed at the peripheral edge part of the circuit forming surface of the main semiconductor device and the metal foil leads of the lead frame, and a step of mounting the semiconductor device onto the circuit board by placing the semiconductor device on the circuit board and heating it, so as to cause the bumps of the main semiconductor device to reflow.

The above method is a method using a lead frame. In this method as well as the previously described method using a flexible substrate, the handling of the main semiconductor device and the conductors when making electrical connections is facilitated, thereby improving the ease of device mounting.

In the above-described method, it is desirable to inject resin into the space between the semiconductor device and the circuit board after mounting the semiconductor device onto the circuit board. According to this arrangement, insulation is provided by the resin between the bumps making electrical connections the semiconductor device and the circuit board, thereby achieving highly reliable connections between the semiconductor device and the circuit board.

Additionally, if there is an unneeded part of the flexible substrate or lead frame in the above-described methods, it is desirable that the unneeded part be removed after mounting the semiconductor device onto the circuit board.

DETAILED DESCRIPTION OF THE PREFERRED EMBODIMENTS

Embodiments of the present invention are described in detail below, with references made to relevant accompanying drawings.

Specifically, a first embodiment of the present invention is described below, with references made to FIGS. 1(a) and 1(b) to FIG. 7.

Figure 1A:
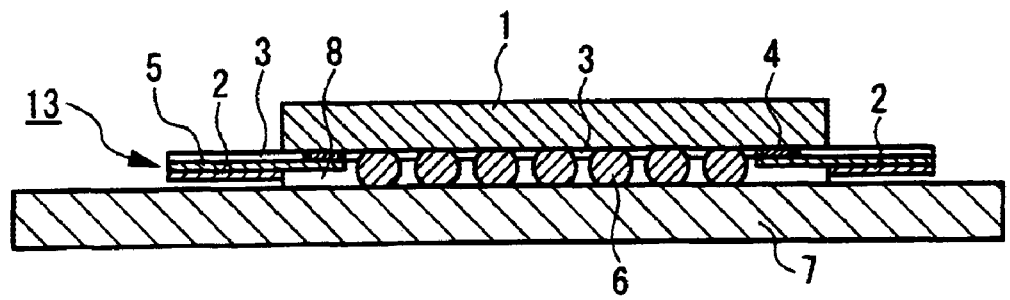
FIG. 1(a) and 1(b) are cross-sectional views showing the condition of mounting of a semiconductor device according to a first embodiment of the present invention to a circuit board.
Figure 1B:
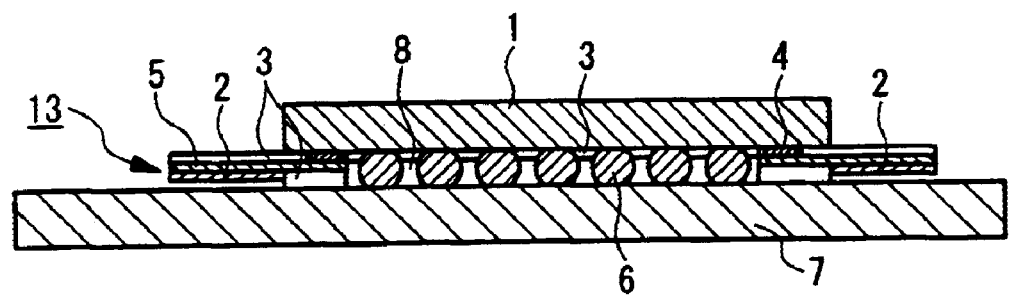
Figure 2:
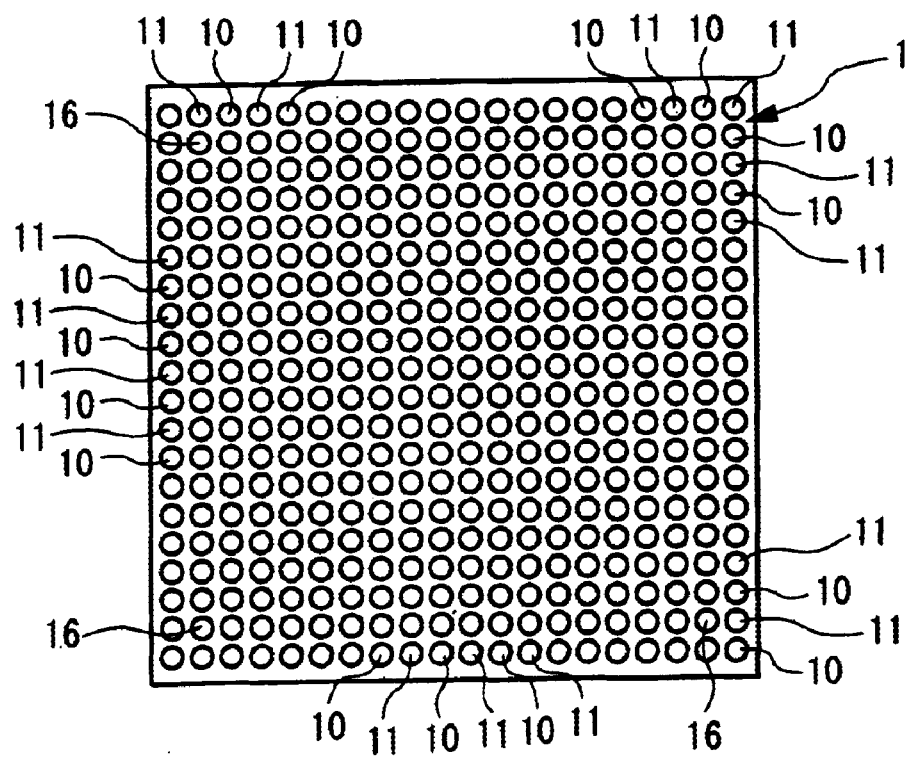
FIG. 2 is a plan view showing the circuit-formation surface of a LSI device that serves as the main semiconductor device according to the first embodiment.
Figure 3:
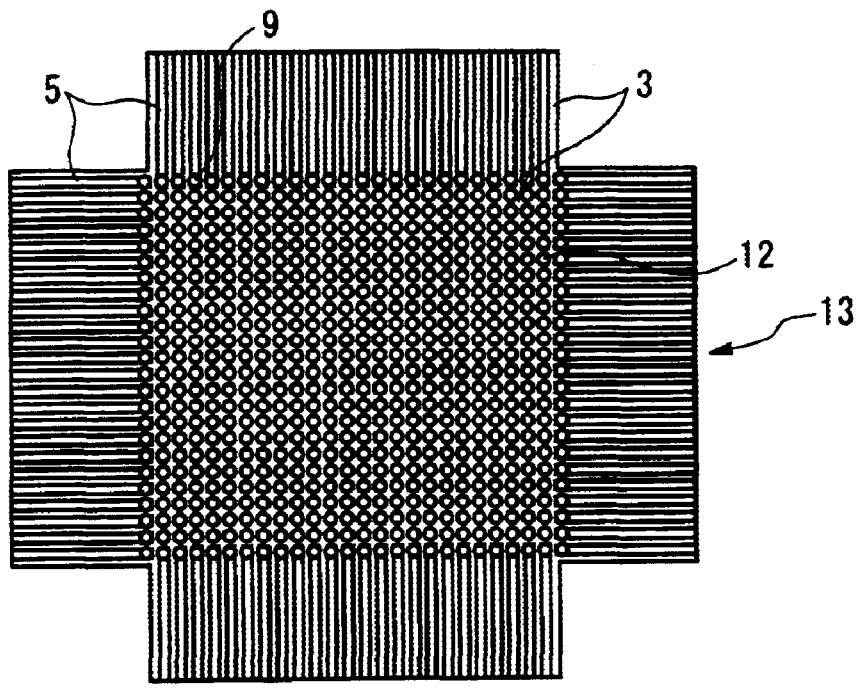
FIG. 3 is a plan view showing the plane of connection between the flexible substrate and the LSI device in the first embodiment.
Figure 4:
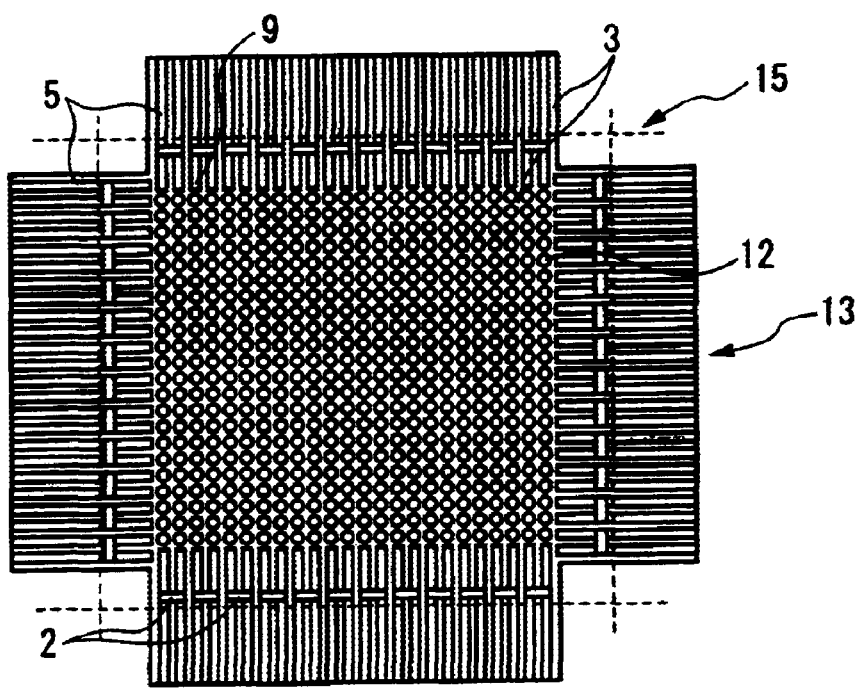
FIG. 4 is a plan view showing the condition of the decoupling capacitors mounted to the flexible substrate of FIG. 3.
Figure 5:
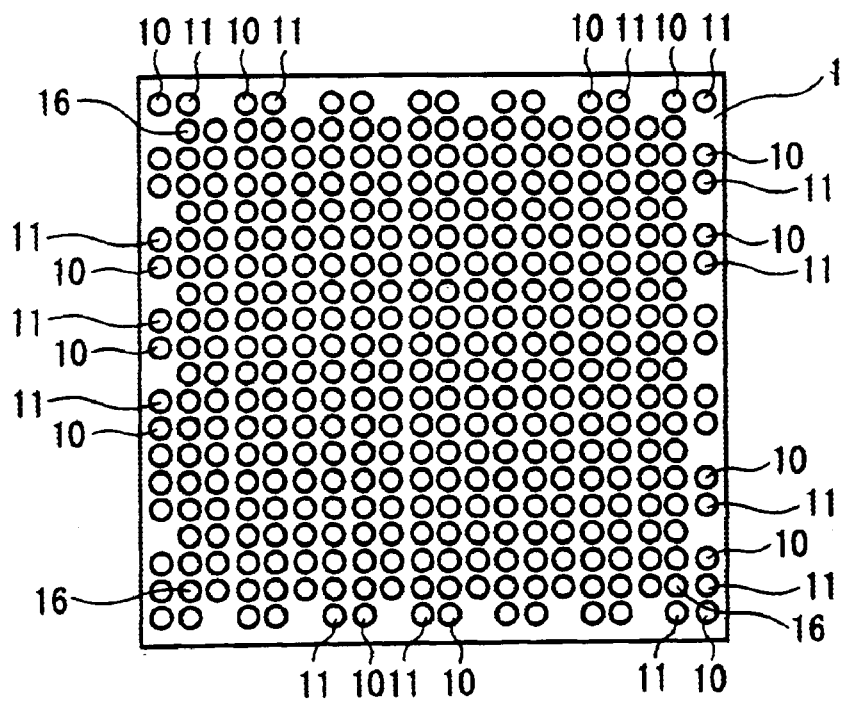
FIG. 5 is a plan view showing the circuit-formation surface of another example of a LSI device.
Figure 6:
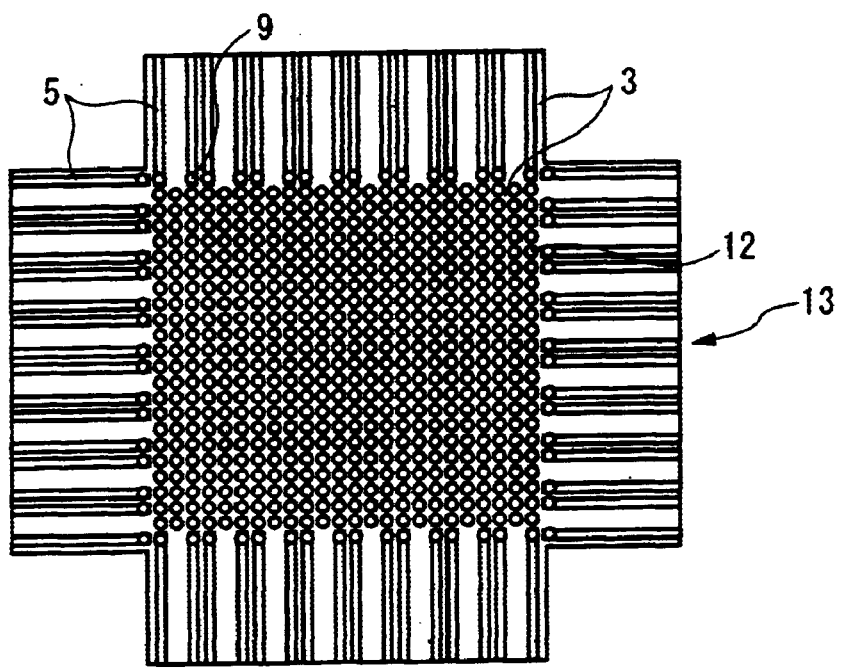
FIG. 6 is a plan view showing the plane of connection between another example of a flexible substrate and a LSI device.
Figure 7:
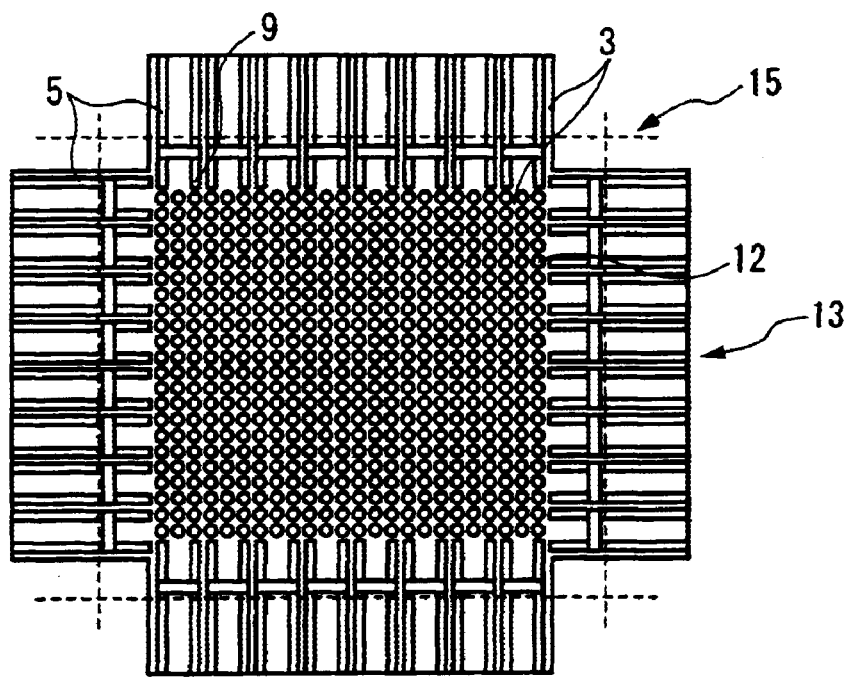
FIG. 7 is a plan view showing the condition of decoupling capacitors mounted to the flexible substrate of FIG. 6.

In the semiconductor device of this first embodiment, a flexible substrate is joined to the surface (circuit-formation surface) of an LSI device, FIG. 1(a) and FIG. 1(b) being cross-sectional views showing the condition of mounting a semiconductor device of this embodiment to a circuit board, FIG. 2 is a plan view showing the circuit-formation surface of an LSI device, FIG. 3 is a plan view showing the plane of connection between a flexible substrate and an LSI device, FIG. 4 is a plan view showing the condition of the decoupling capacitors mounted to the flexible substrate of FIG. 3, FIG. 5 is a plan view showing the circuit-formation surface of another example of an LSI device (main LSI device), this being referred to as the front surface thereof, and the opposite surface of the LSI device being referred to as the rear surface thereof hereinafter, FIG. 6 is a plan view showing the plan of connection of another example of flexible substrate with an LSI device, and FIG. 7 is a plan view showing the condition in which decoupling capacitors are mounted to the flexible substrate of FIG. 6.

As shown in FIG. 1(a) and FIG. 1(b), the semiconductor device of this embodiment is mainly formed by a flexible substrate 13 made up of an LSI device 1 (main semiconductor device), a metal foil lead 5 (conductor) and an insulation layer 3, and a decoupling capacitor 2. On the outermost peripheral edge part (peripheral part) of the circuit-formation surface of the LSI device 1 are alternately disposed power supply line connection pads 10 and ground line connection pads 11, as shown in FIG. 2 or FIG. 5. In other regions, although electrode pads 16 for signal line connection pads and the like are provided, these can include a power supply line connection pad 10 or a ground line connection pad 11. FIG. 2 is an example in which the outermost peripheral power supply line connection pads 10 and ground line connection pads 11 are disposed with uniform spacing, in the same manner as the inside electrode pads 16. In contrast to this, FIG. 5 shows an example in which the outermost peripheral power supply line connection pads 10 and ground line connection pads 11, unlike the inside electrode pads 16, are disposed with one position open therebetween.

FIG. 3 and FIG. 6 show a flexible substrate 13 corresponding to the LSI device 1, FIG. 3 showing a flexible substrate corresponding to the LSI device of FIG. 2 and FIG. 6 showing a flexible substrate corresponding to the LSI device of FIG. 5. In both FIG. 3 and FIG. 6 a large number of metal foil leads 5 corresponding to either one of the power supply line connection pads 10 and ground line connection pads 11, are provided so as to extend outwardly from the outside contour of the LSI device 1 on one surface of the insulation layer 3, and electrode pads 9 are provided on the end part of the metal foil leads 5. Thus, only the insulation layer 3 exists in the center region of the LSI device 1, and the insulation layer 3 in this part has a large number of holes 12, of a diameter that just allows the passage of bumps, to be described below, corresponding to positions of the electrode pads 16 on the inside of the LSI device 1.

The metal foil leads 5 of the flexible substrate 13 are formed by a conductive material such as copper or aluminum, having a thickness of, for example, 20 $\mu$m or less. The insulation layer 3 is made of a material such as polyimide, polyethylene terephthalate (PET), acrylic resin, or fiberglass-based epoxy resin or the like. If a thermoplastic adhesive is used as this insulation layer 3, it is possible to use the insulation layer 3 to adhere the LSI device 1 to the flexible substrate 13.

FIG. 4 and FIG. 7 show the condition in which decoupling capacitors 2 are mounted on the flexible substrate 13, FIG. 4 corresponding to FIG. 3, and FIG. 7 corresponding to FIG. 6. In both FIG. 4 and FIG. 7, decoupling capacitors are mounted so as to straddle across two neighboring metal foil leads 5, one metal foil lead 5 connected to a power supply line connection pad 10 of the LSI device 1 and one metal foil lead 5 connected to a ground line connection pad 11 of the LSI device 1. The decoupling capacitors 2 used in this case are chip capacitors, such as laminated ceramic capacitors, tantalum capacitors, aluminum electrolytic capacitors, or organic capacitors or the like, which are mounted to the metal foil leads 5 by means of solder or conductive paste. Although the above-noted four types of chip capacitors can be used as the decoupling capacitors 2, laminated ceramic capacitors, which have small parasitic inductance and can provide a large capacitance, are suited for this use.

As shown in FIG. 1(a) and FIG. 1(b), connections between the power supply line connection pads 10 and ground line connection pads 11 at the outermost periphery of the LSI device 1 and the electrode pads 9 provided at an end portion of the metal foil leads 5 of the flexible substrate 13 are connected to each other with making use of the bumps 4. The material of the bumps 4 can be solder or gold or the like. The insulation layer 3 not only provides insulation between the LSI device 1 and the metal foil leads 5 of the flexible substrate 13, but also holds these two elements together. Bumps 6, made of solder or the like, are formed on the large number of electrode pads 16 on the inside region of the LSI device 1, each of these bumps 6 passing through a hole 12 provided in the insulation layer 3, so as to make connection to the circuit board 7.

The configuration shown in FIG. 1(a) is one in which the insulation layer 3 exists only on one side of the metal foil leads 5 (the surface toward the LSI device 1), with no insulation layer 3 existing on the opposite side thereof. That is, this is the condition in which the front surfaces of the metal foil leads 5 and the circuit board 7 face one another. Given this arrangement, in order to maintain the insulation between the metal foil leads 5 and the circuit board 7, and in order to increase the reliability of the connections between the LSI device 1 and the circuit board 7, an underfill resin 8 is injected between the semiconductor device and the circuit board 7.

In contrast to the above, the configuration shown in FIG. 1(b) is the example in which the insulation layer 3 exists on both surfaces of the metal foil leads 5. That is, the insulation layer 3 exist not only between the metal foil leads 5 and the circuit-formation surface of the LSI device 1, but also between the metal foil leads 5 and the circuit board 7, so as to maintain the insulation between the metal foil leads 5 and the circuit board 7. In order to increase the reliability of the connections between the LSI device 1 and the circuit board 7, however, an underfill resin 8 is injected between the semiconductor device and the circuit board 7. It is possible to use, for example, an epoxy resin as the underfill resin 8.

A method of mounting a LSI device having the above-described configuration to a circuit board is described in detail below.

First, referring to FIG. 2 or FIG. 5, a LSI device 1 having electrode pads 16 disposed thereon is fabricated, and bumps 4 are mounted on the pads 10 and 11 at the outermost periphery of the circuit-formation surface. A flexible substrate 13 is formed such as shown in FIG. 3 or FIG. 6. Next, connections are made between the bumps 4 on the LSI device 1 and the electrode pads 9 of the flexible substrate 13. Next, bumps 6 are mounted, these to be used to make connections to the circuit board, are mounded on the electrode pads 16 provided in locations on the circuit-formation surface of the LSI device 1 and other than the locations of the pads 10 and 11 at the outermost peripheral part thereof and, as shown in FIG. 4 or FIG. 7, decoupling capacitors 2 are mounted on the flexible substrate 13, so as to form the semiconductor device. Finally, the semiconductor device is placed on the circuit board 7 and heated, thereby reflow of the bumps 6 connected to the electrode pads 16 of the LSI device 1, so as to mount the LSI device 1 to the circuit board 7. An underfill resin 8 is then injected into the space between the semiconductor device and the circuit board 7. Finally, the excess parts of the flexible substrate 13 are removed along the cutting line 15 (indicated by the broken lines shown in FIG. 4 and FIG. 7). The above-noted steps enable mounting of the above-noted semiconductor device onto the circuit board 7.

In a semiconductor device according to this embodiment, because decoupling capacitors 2 are directly mounted onto the metal foil leads 5 of the semiconductor device itself, the length of the wiring between the LSI device 1 and the decoupling capacitors 2 can be shortened to several hundred $\mu$m, for example. As a result, it is possible to reduce the parasitic inductance of the wiring to, for example, several tens of pH, thereby enabling the decoupling capacitors to serve in their intended function, so that it is possible to suppress or compensate for a momentary drop in DC voltage in the circuit.

By mounting capacitors on the metal foil leads 5, a reduction in mounting space is achieved, therefore contribution to a reduction in the size of a circuit board 7 to which the LSI device 1 is mounted, can be achieved.

Additionally, because it is possible to mount many decoupling capacitors 2 to a single LSI device 1, by enabling the mounting of a large number of low-inductance capacitors, it is possible not only to reduce the parasitic inductance of the individual decoupling capacitors themselves, but also to increase the overall capacitance, thereby increasing the LC resonant frequency.

In addition, because the semiconductor device is made of the flexible substrate 13 in which the metal foil leads 5 and the insulation layer 3 are intrinsically integrated into one body, the handling of these parts when making connections between the LSI device 1 and the metal foil leads 5 is facilitated in the process of manufacturing the semiconductor device, thereby increasing working efficiency for manufacturing thereof becomes easy. In the case in which the flexible substrate 13 is used, because the thickness of the metal foil leads 5 is generally 18 $\mu$m or smaller, and which is thinner than that of the conductors (approximately 50 to 100 $\mu$m) used in the lead it is possible to reduce the gap between the semiconductor device and the circuit board 7, thereby enabling an overall reduction in thickness. Stated in reverse, in the case in which the gap between the LSI device and the circuit board 7 is small, because it is possible to make the bumps 6 small, there is the advantage of being able to improve the packaging density of the electrode pads 16.

Figure 8A:
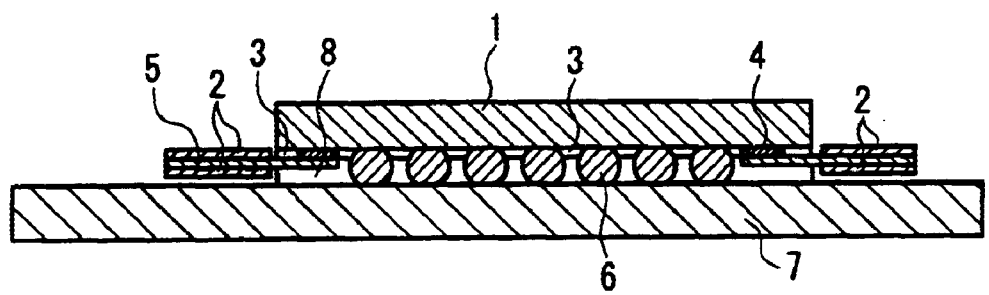
FIGS. 8(a) and 8(b) are cross-sectional views showing the condition of a semiconductor device according to a second embodiment of the present invention mounted to a circuit board.
Figure 8B:
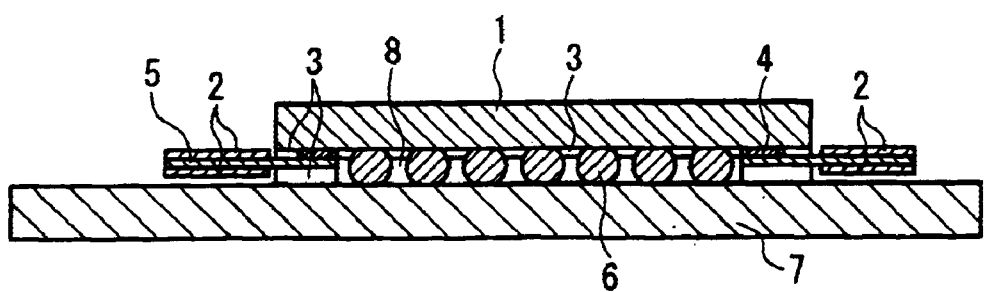
Figure 9:
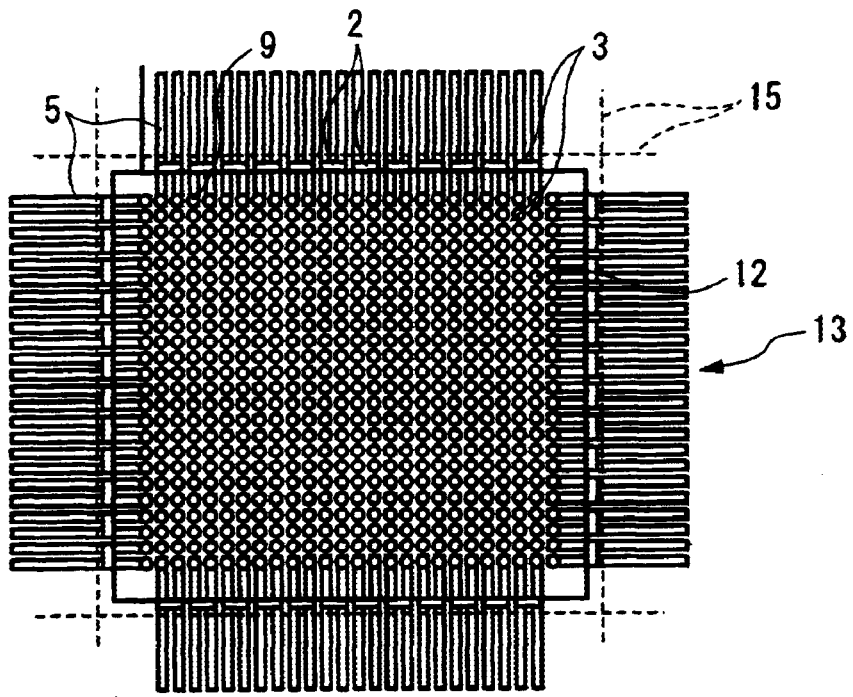
FIG. 9 is a plan view showing the plane of connection between the flexible substrate used in the semiconductor device and a LSI device according to the second embodiment.
Figure 10:
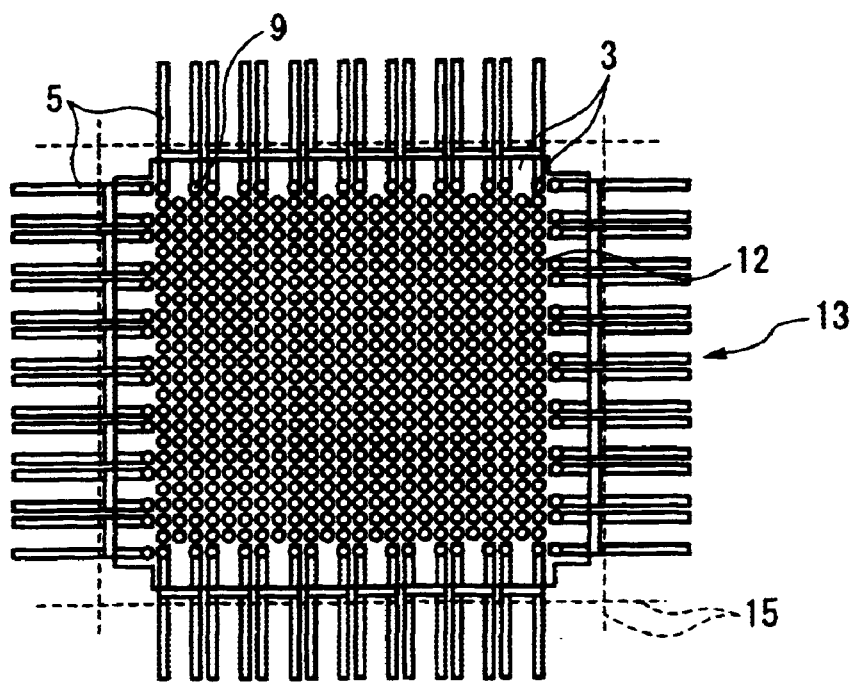
FIG. 10 is a plan view showing the plane of connection between another example of a flexible substrate and a LSI device.

A second embodiment of the present invention is described below, with references being made to FIG. 8 through FIG. 10. FIG. 8(a) and FIG. 8(b) are cross-sectional views showing the condition of a semiconductor device according to this embodiment mounted to a circuit board, FIG. 9 is a plan view showing the plane of connection of a flexible substrate with the LSI device, FIG. 10 is a plan view showing the plane of connection of another example of a flexible substrate with an LSI device. FIG. 9 shows the example the a flexible substrate corresponding to the LSI device shown in the first embodiment shown in FIG. 2, and FIG. 10 shows the example of a flexible substrate corresponding to the LSI device shown in the first embodiment shown in FIG. 5. The semiconductor device of this embodiment as well uses a flexible substrate, the basic configuration thereof being similar to that of the first embodiment, with the difference being that decoupling capacitor are mounted on both surfaces of the metal foil leads. Given this similarity, elements of FIG. 8 through FIG. 10 that are similar to those of FIG. 1 through FIG. 7 are assigned the same reference numerals and are not explicitly described herein.

In contrast to the first embodiment shown in FIG. 1(a) and FIG. 1(b), in which the insulation layer 3 is provided over the entire surface of at least one side of the metal foil leads 5 (that which opposes the LSI device), in the LSI device of the second embodiment, as shown in FIG. 8(a) and FIG. 8(b), the insulation layer 3 is provided on neither surface of the in the end sides parts of the metal foil leads 5 (the LSI device sides). On both sides of the metal foil leads 5 where the insulation layer 3 is not provided, there are mounted decoupling capacitors 2. The use of chip capacitors such as laminated ceramic capacitors and the ability to use solder or conductive paste to mount the decoupling capacitors is the same as in the first embodiment. Other features of this embodiment are similar to the first embodiment. FIG. 8(a), similar to FIG. 1(a), shows the case in which the insulation layer 3 exists on only one surface of the metal foil leads 5 at the outer edge part of the LSI device 1, with underfill resin 8 injected at the surface on the other side, whereas FIG. 8(b), similar to FIG. 1(b), shows the example in which the insulation layer 3 exists on both surfaces of the metal foil leads 5 at the outer edge part of the LSI device 1.

The second embodiment of the present invention achieves the same type of effects as the first, in that it can effectively suppress and compensate for a momentary drop in DC voltage, contribute to the reduction in size of a circuit board, raise the LC resonant frequency, and improve the ease of component mounting. Additionally, in the case of the second embodiment because it is possible to mount double the number of decoupling capacitor as in the first embodiment, there is a further reduction in variation of DC voltage supplied to the LSI device 1.

A third embodiment of the present invention is described below, with references made to FIG. 11 and FIG. 12.

Figure 11A:
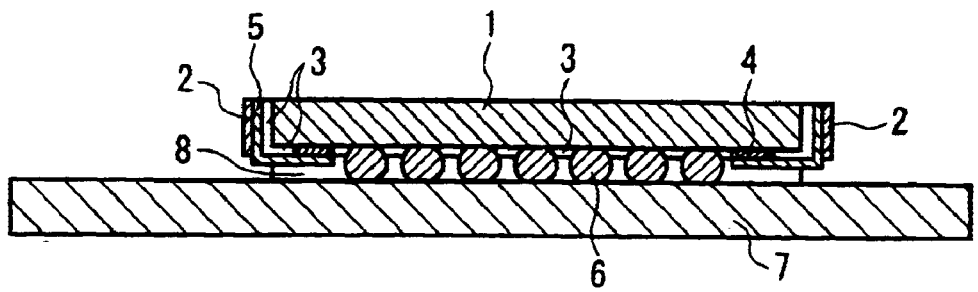
FIG. 11 is a cross-sectional view showing the condition of a semiconductor device according to a third embodiment of the present invention mounted to a circuit board.
Figure 11B:
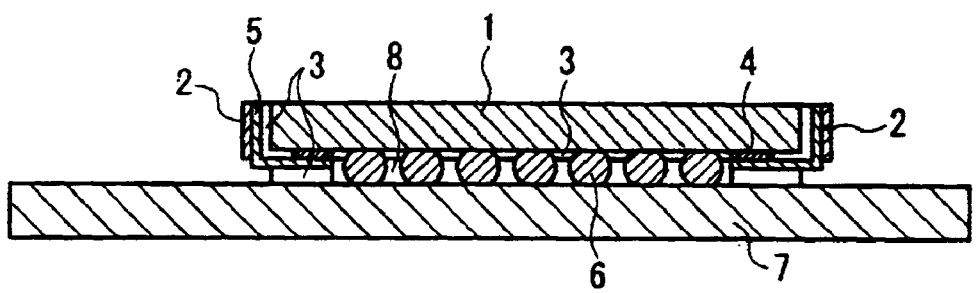
Figure 12A:
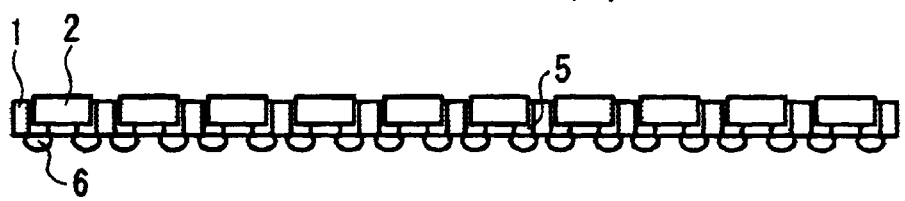
FIG. 12 is a side view of the semiconductor device according to the third embodiment.
Figure 12B:
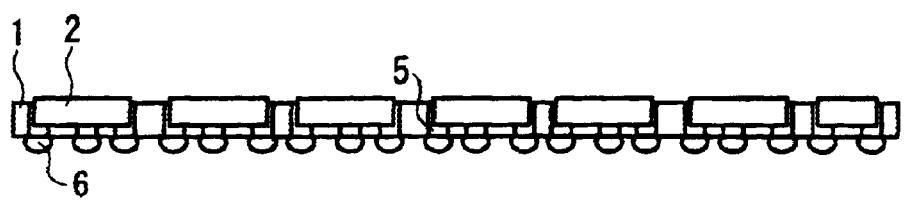

FIG. 11(a) and FIG. 11(b) a cross-sectional views showing the condition of a semiconductor device according to this embodiment mounted to a circuit board, FIG. 12(a) and FIG. 12(b) are side views of the LSI device according to this embodiment. FIG. 12(a) shows an LSI device corresponding to the LSI device of the first embodiment shown in FIG. 1, while FIG. 12(b) shows an LSI device corresponding to the LSI device of the first embodiment shown in FIG. 5. The LSI device of this embodiment also uses a flexible substrate, and the basic configuration is the same as that of the first embodiment, the difference in this case being that the metal foil leads are bent to the side surface of the LSI device. Given this similarity, elements of FIG. 11 and FIG. 12 similar to elements of FIG. 1 through FIG. 7 are assigned the same reference numerals, and are not explicitly described herein.

In the LSI device according to the third embodiment, as shown in FIG. 11(a) and FIG. 11(b), the LSI device 1 and the metal foil leads 5 of the flexible substrate 13 are insulated by an insulation layer 3 exhibiting thermopasticity, made of a polyimide or the like as its main constituent material. As shown in FIG. 12(a) or FIG. 12(b), decoupling capacitors 2 are mounted using a conductive paste such as solder to the metal foil leads 5 of the flexible substrate adhered to the side surface of the LSI device 1. Other features of the embodiment are similar to those of the first embodiment. FIG. 11(a), similar to FIG. 1(a), shows the example in which the insulation layer 3 exists on only one surface of the metal foil leads 5 at the peripheral part of the LSI device 1, with an underfill resin 8 injected at the other surface, while FIG. 11(b) shows the example in which the insulation layer 3 is provided on both surfaces of the metal foil leads 5 at the peripheral part of the LSI device 1.

The third embodiment of the present invention achieves the same type of effects as the first, in that it can effectively suppress and compensate for a momentary drop in DC voltage, contribute to the reduction in size of a circuit board, raise the LC resonant frequency, and improve the ease of component mounting. Additionally, in the case of the third embodiment because decoupling capacitors 2 are fixed to the flexible substrate 13 with the flexible substrate, which includes the metal foil leads 5, bent to the side surface of the LSI device 1, there is a reduction in the amount of surface area occupied by the semiconductor device on the circuit board 7 compared with the case of the first embodiment, thereby enabling a further reduction in the size of the circuit board 7.

A fourth embodiment of the present invention is described below, with reference being made to FIG. 13.

Figure 13A:
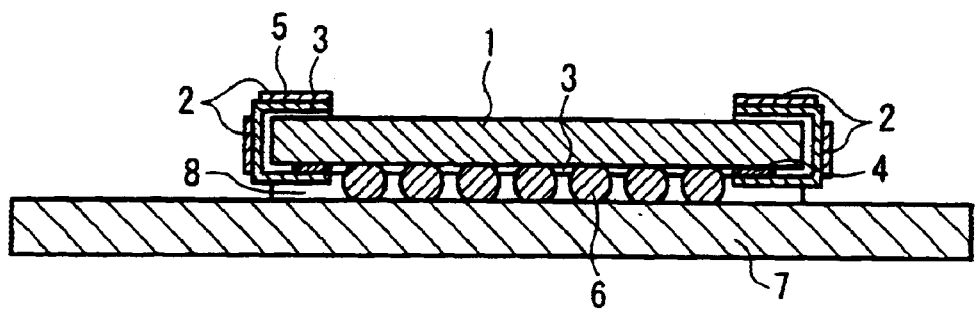
FIG. 13 is a cross-sectional view showing the condition of a semiconductor device according to a fourth embodiment of the present invention mounted to a circuit board.
Figure 13B:
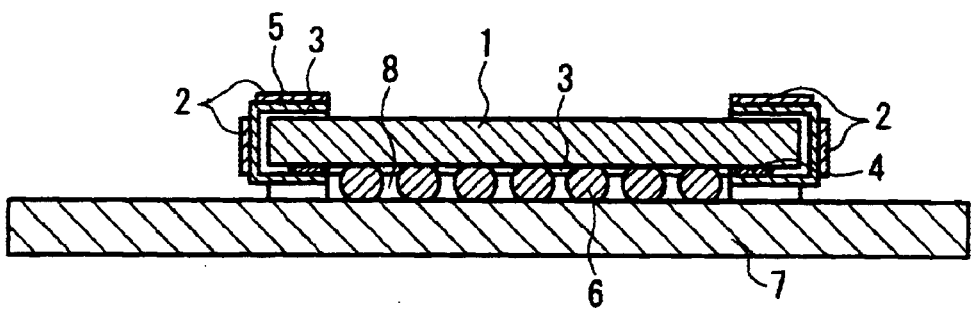

FIG. 13(a) and FIG. 13(b) are cross-sectional view showing the condition of a LSI device according to the fourth embodiment mounted to a circuit board. The LSI device of this embodiment as well uses a flexible substrate, and has other features which are similar to the first embodiment, the difference in this case being that there is a further bending of the metal foil leads 5 beyond the bending thereof in the third embodiment, so to bend the metal foil leads 5 to the rear surface side of the LSI device. Given this similarity, elements in common with those shown in FIG. 1 through FIG. 7 are assigned the same reference numerals and are not explicitly described herein.

In a LSI device according to this embodiment, as shown in FIG. 13(a) and FIG. 13(b), the LSI device 1 and the metal foil leads 5 of the flexible substrate 13 are insulated by an insulation layer 3 exhibiting thermopasticity, made of a polyimide or the like as its main constituent material, the flexible substrate 13 formed by the metal foil leads 5 and the insulation layer 3 being bent to the from the circuit-formation surface of the LSI device 1 to the side surface, and further bent to the rear surface (top surface of the LSI device 1 in the drawing), in which condition it is bonded using heat. Decoupling capacitors 2 in the form of chip capacitors are mounted using a conductive paste such as solder to the metal foil leads 5 of the flexible substrate 13 adhered to the side surface and rear surface of the LSI device 1. Other features of the fourth embodiment are similar to those of the first embodiment. FIG. 13(a), similar to FIG. 1(a), shows the example in which the insulation layer 3 exists on only one surface of the metal foil leads 5 at the peripheral part of the LSI device 1, with an underfill resin 8 injected at the other surface, while FIG. 13(b), similar to FIG. 1(b), shows the example in which the insulation layer 3 is provided on both surfaces of the metal foil leads 5 at the peripheral part of the LSI device 1.

The fourth embodiment of the present invention achieves the same type of effects as the first, in that it can effectively suppress and compensate for a momentary drop in DC voltage, contribute to the reduction in size of a circuit board, raise the LC resonant frequency, and improve the ease of component mounting. Additionally, similar to the case of the third embodiment, because there is a reduction in the surface area occupied by the semiconductor device and because it is possible to mount a plurality of times the number of decoupling capacitors as in the case of the first or the third embodiment, it is possible to suppress the variation in DC voltage supplied to the LSI device 1 to a small amount. However, because the longer the distances from the power supply line connection pads 10 and the ground line connection pads 11 of the LSI device 1 to the decoupling capacitors 2 become, the greater becomes the parasitic inductance existing in the wiring, even in the case in which decoupling capacitors are mounted on the rear surface, it is preferable that the wiring length thereof be kept to within 1 mm.

A fifth embodiment of the present invention is described below, with references made to FIG. 14 through FIG. 18.

Figure 14A:
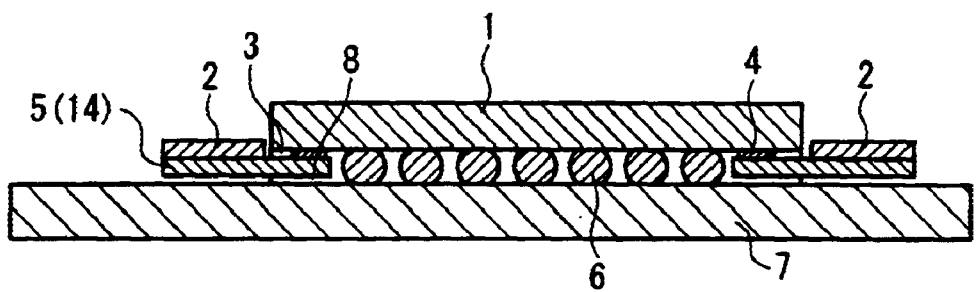
FIG. 14 is a cross-sectional view showing the condition of a semiconductor device according to a fifth embodiment of the present invention mounted to a circuit board.
Figure 14B:
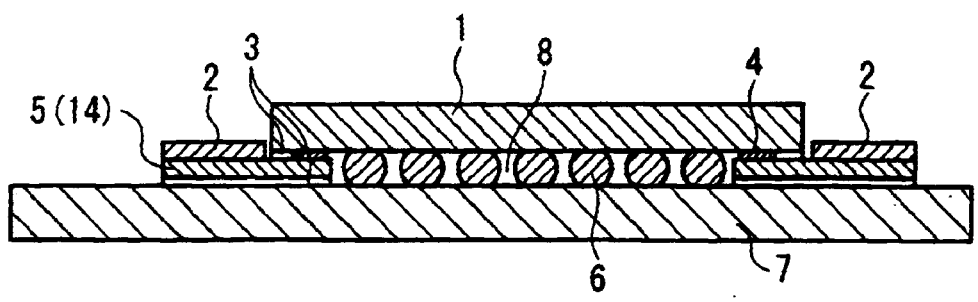
Figure 15:
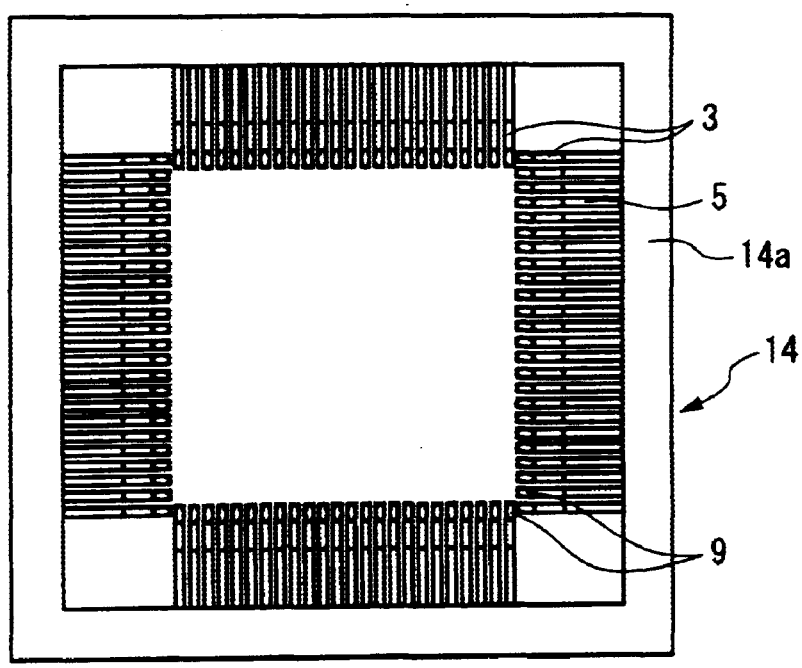
FIG. 15 is a plan view of the plane of connection between a lead frame of the fifth embodiment and a LSI device.

In palace of the flexible substrate used in the embodiments described above, a LSI device according to the fifth embodiment of the present invention makes use of a lead frame joined to the rear surface (circuit-formation surface) of the LSI device (main semiconductor device). FIG. 14(a) and FIG. 14(b) are cross-sectional views showing the condition of this semiconductor device mounted to a circuit board, and FIG. 15 is a plan view showing the plane of connection between the lead frame and the LSI device. Because the basic configuration is similar to that of the first embodiment, in the drawings referenced below, elements in common with elements in FIG. 1 through FIG. 7 are assigned the same reference numerals.

Figure 16:
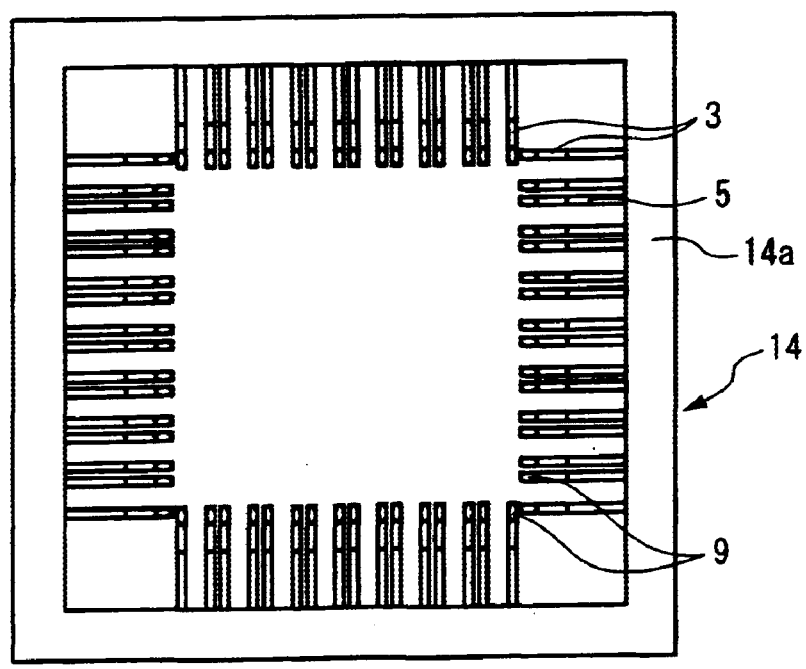
FIG. 16 is a plan view showing the plane of connection with another example of a lead frame and a LSI device.

As shown in FIG. 14(a) and FIG. 14(b), the semiconductor device according to the fifth embodiment is basically formed by the LSI device 1, the lead frame 14, and the decoupling capacitors 2. The configuration of the LSI device 1 itself is similar to that of the first embodiment, as illustrated in FIG. 2 or FIG. 5. FIG. 15 and FIG. 16 show lead frames corresponding the LSI device 1, FIG. 15 showing the lead frame corresponding to the LSI device of FIG. 2 and FIG. 16 showing the lead frame corresponding to the LSI device of FIG. 5. The lead frames shown in both FIG. 15 and FIG. 16 are provided, within an outer frame 14a, with metal foil leads 5 extending toward the outermost periphery of the LSI device 1 in correspondence to the power supply line connection pads 10 and ground line connection pads 11 at the outermost periphery of the LSI device, electrode pads 9 being provided at the end parts of the metal foil leads 5. In contrast to the flexible substrate 13 of the first embodiment, in which the insulation layer 3 is provided over the entire surface, in the fifth embodiment the insulation layer is provided only over the metal foil leads 5 at the lead frame 14.

The metal foil leads 5 of the lead frame 14 are formed of a conductive material, such as copper or aluminum, to a thickness of, for example, 100 ìm or smaller. The insulation layer 3 provides insulation by a polyimide, a polyethelene terephthalate (PET), an acrylic resin, or a fiberglass-based epoxy resin. If a thermoplastic adhesive is used as this insulation layer 3, it is possible to use the insulation layer 3 to adhere the LSI device 1 to the lead frame 14.

Figure 17:
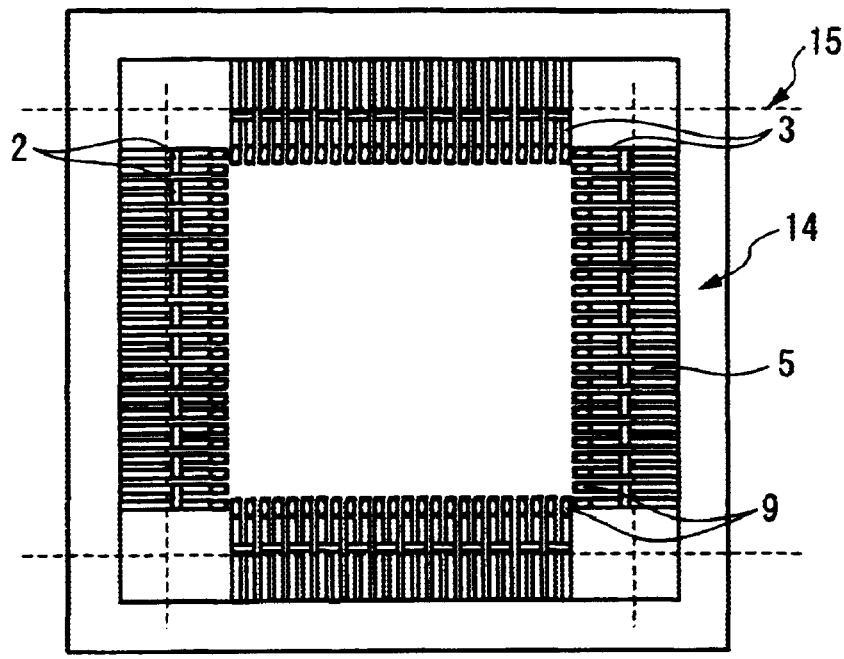
FIG. 17 is a plan view showing the condition of decoupling capacitors mounted to the lead frame of FIG. 15.
Figure 18:
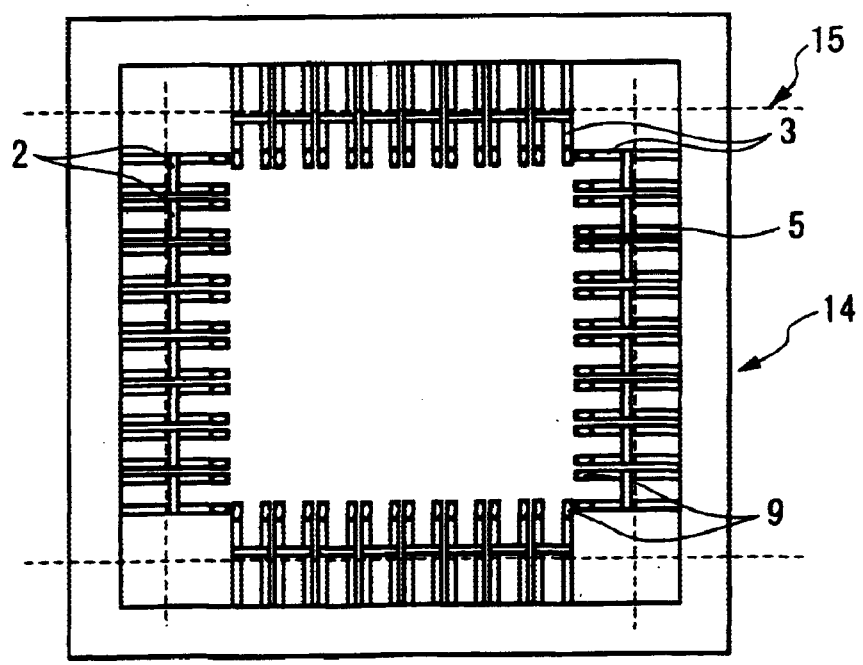
FIG. 18 is a plan view showing the condition of decoupling capacitors mounted to the lead frame of FIG. 16.

FIG. 17 and FIG. 18 show the condition in which decoupling capacitors 2 are mounted to these lead frames 14, FIG. 17 corresponding to FIG. 15 and FIG. 18 corresponding to f 16. With the lead frames 14 of both FIG. 17 and FIG. 18, decoupling capacitors 2 are mounted so as to straddle across two neighboring metal foil leads 5, one metal foil lead 5 connected to a power supply line connection pad 10 of the LSI device 1 and one metal foil lead 5 connected to a ground line connection pad 11 of the LSI device 1. The decoupling capacitors 2 used in this case are chip capacitors, such as laminated ceramic capacitors, which are mounted to the metal foil leads 5 by a conductive paste such as solder.

As shown in FIG. 14(a) and FIG. 14(b), connections are made between the power supply line connection pads 10 and the ground line connection pads 11 at the outermost periphery of the LSI device 1 and electrode pads 9 of the metal foil leads 5 of the lead frame 14 by means of bumps 4, which are made of, for example, solder or gold. The LSI device 1 and metal foil leads 5 of the lead frame 14 are both insulated and held together by the insulation layer 3. Bumps 6 of solder or the like are formed on a large number of electrode pads 16 on the inside region of the LSI device 1, these bumps 6 making connections to the circuit board 7.

The configuration shown in FIG. 14(a) is the example in which the insulation layer 3 exists only on one side (the side facing the LSI device 1) of the metal foil leads 5, there being absolutely no insulation layer 3 on the opposite side. That is, the metal foil leads 5 and the front surface of the circuit board 7 is facing one another. In this condition, in order to maintain the insulation between the metal foil leads 5 and the circuit board 7 and to increase the connection reliability between the LSI device 1 and the circuit board 7, an underfill resin 8 is injected in the space between the semiconductor device and the circuit board 7.

In contrast to the above, in the configuration shown in FIG. 14(b), we see the example in which the insulation layer 3 exists on both sides of the metal foil leads 5. That is, the insulation layer 3 exists not only on the metal foil leads 5 and circuit-formation surface, but also between the metal foil leads 5 and the circuit board 7. However, in order to increase the reliability of the connections between the LSI device 1 and the circuit board 7, an underfill resin 8 is injected into the space between the LSI device and the circuit board 7. The material of the underfill resin 8 can be the same as described with regard to the first embodiment.

A method for mounting a semiconductor device to a circuit board according to the present invention is described below.

First, an LSI device 1 having electrode pads positioned as shown in FIG. 2 or FIG. 5 is fabricated, and bumps 4 are placed on the pads 10 and 11 on the outermost periphery of the circuit-formation surface. Additionally, a lead frame 14 such as shown in FIG. 15 or FIG. 16 is fabricated. Next, connection is made between the bumps 4 on the LSI device and the electrode pads 9 of the lead frame 14. Next, bumps 6 used to make connections with the circuit board 7 are placed on the electrode pads 16 at locations other than the pads 10 and 11 on the outermost periphery of the LSI device 1 and, as shown in FIG. 4 or FIG. 7, decoupling capacitors 2 are mounted onto the lead frame 14, so as to fabricate the semiconductor device. After this is done, the semiconductor device is place on the circuit board 7 and heated, so as to cause the bumps 6 connected to the electrode pads 16 of the LSI device 1 to reflow, thereby mounting the semiconductor device to the circuit board 7. Underfill resin 8 is then injected in the space between the semiconductor device and the circuit board 7. Finally, an unneeded part of the lead frame 14 is cut away, along the cutting line 15 (indicated by the broken line 15 in FIG. 17 and FIG. 18). The above process steps achieve mounting of the above-noted semiconductor device to the circuit board 7.

The semiconductor device of this embodiment as well achieves the same type of effects as the first, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, and improve the ease of component mounting.

A sixth embodiment of the present invention is described below, with references being made to FIG. 19.

Figure 19A:
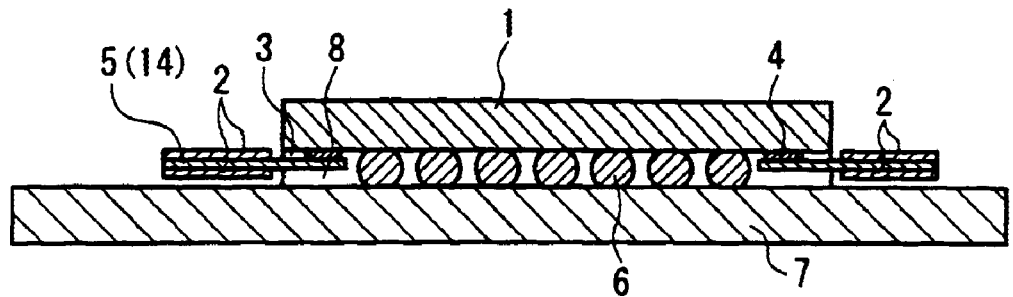
FIG. 19 is a cross-sectional view showing the condition of a semiconductor device according to a sixth embodiment of the present invention mounted to a circuit board.
Figure 19B:
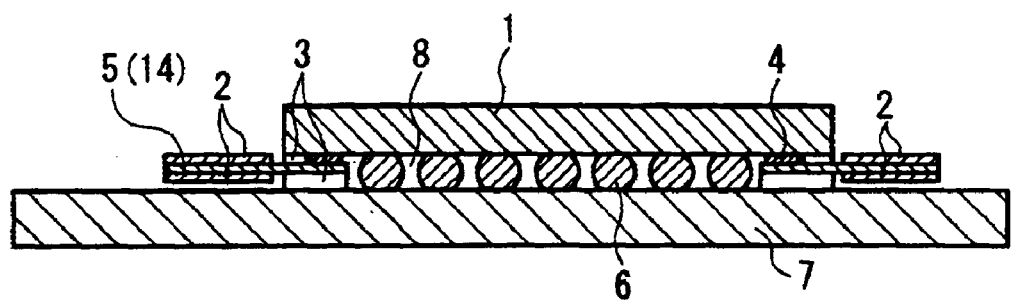

FIG. 19(a) and FIG. 19(b) are cross-sectional views showing the condition in which a semiconductor device according to the present invention is mounted to a circuit board. In the semiconductor device of this embodiment as well a lead frame is used, and the basic configuration is the same as the fifth embodiment, the difference being that decoupling capacitors are mounted to both sides of the metal foil leads. In view of this similarity, elements in common with those of FIG. 14 through FIG. 18 are assigned the same reference numerals and are not explicitly described herein.

In the case of a semiconductor device according to this embodiment, as shown in FIG. 19(a) and FIG. 19(b), the insulation layer 3 is provided on both sides on one end part (LSI outer end) of the metal foil leads 5. Decoupling capacitors 2 are then provided on both sides of the metal foil leads 5 on which the insulation layer 3 is not provided. The use of chip capacitors such as laminated ceramic capacitors as the decoupling capacitors 2 and the mounting of the decoupling capacitors 2 using conductive paste such as solder are the same as described with regard to the fifth embodiment. Other features are also the same as the fifth embodiment. Similar to FIG. 14(a), FIG. 19(a) shows the example in which the insulation layer 3 is provided only on one side of the metal foil leads 5 at peripheral edge part of the LSI device 1, with underfill resin 8 injected on the other surface side, while FIG. 19(b), similar to FIG. 14(b), shows the example in which the insulation layer 3 is provided on both sides of the metal foil leads 5 at the peripheral edge part of the LSI device 1.

This embodiment of the present invention achieves the same type of effects as the fifth embodiment, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, and improve the ease of component mounting. Additionally, because this embodiment enables double the number of decoupling capacitors to be mounted as in the fifth embodiment, it provides a further reduction in the variation of the DC voltage supplied to the LSI device 1.

A seventh embodiment of the present invention is described below, with references made to FIG. 20.

Figure 20A:
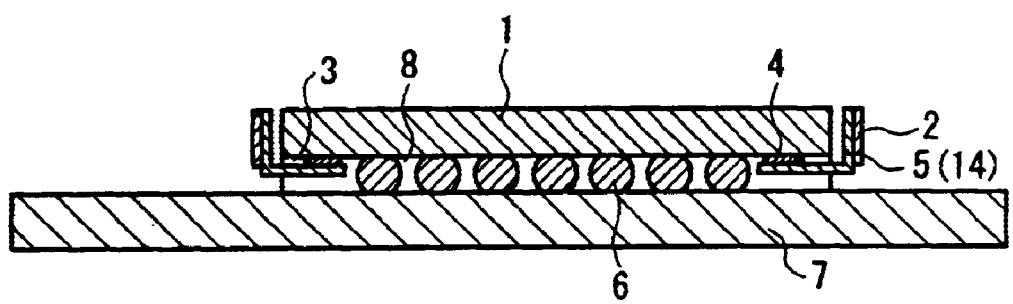
FIG. 20 is a cross-sectional view showing the condition of a semiconductor device according to a seventh embodiment of the present invention mounted to a circuit board.
Figure 20B:
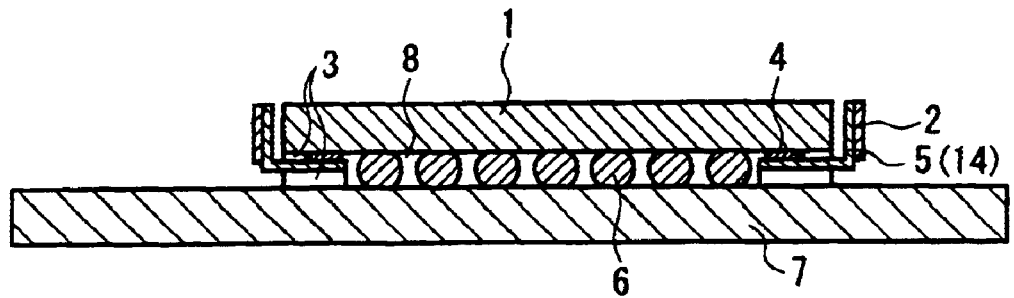

FIG. 20(a) and FIG. 20(b) are cross-sectional views showing the condition of a semiconductor device according to this embodiment mounted to a circuit board. The semiconductor device of this embodiment as well uses a lead frame, and the basic configuration of the embodiment is the same as that of the fifth embodiment, the difference in this case being that metal foil leads are bent to the side surface of the LSI device. Given this similarity, elements in common with those shown in FIG. 14 through FIG. 18 are assigned the same reference numerals and are not explicitly described herein.

In a semiconductor device according to the seventh embodiment, as shown in FIG. 20(a) and FIG. 20(b), the LSI device 1 and the lead frame 14 are insulated by an insulation layer 3, made of, for example, a polyimide as its main constituent material, the metal foil leads 5 being bent along the side surface of the LSI device 1 from the circuit board, and being bonded by heat to at the circuit-formation surface part of the LSI device 1. The metal foil leads 5 are bent along the side surface from the circuit-formation surface of the LSI device 1, which is similar to the third embodiment. In this case, however, in contrast to the third embodiment, in which the a flexible substrate 13 is used and in which the side surface of the LSI device 1 and the metal foil leads 5 are adhered with an intervening insulation layer 3 therebetween, in this embodiment the metal foil leads 5 of the lead frame 14, rather than being in intimate contact with the LSI device 1 at the side surface thereof, stand free. Other features of this embodiment are the same as in the fifth embodiment. Similar to FIG. 14(a), FIG. 20(a) shows the example in which the insulation layer 3 is provided only on one side of the metal foil leads 5 at peripheral edge part of the LSI device 1, with underfill resin 8 injected on the other side surface, while FIG. 20(b), similar to FIG. 14(b), shows the example in which the insulation layer 3 is provided on both sides of the metal foil leads 5 at the peripheral edge part of the LSI device 1.

When the semiconductor device of this embodiment is mounted to a circuit board 7, although it is possible to perform this mounting using the same method as described with regard to the fifth embodiment, it is alternately possible to pre-join the decoupling capacitors 2 to the side of the lead frame that is the opposite of the case of the fifth embodiment, then mount the semiconductor device to the circuit board 7, and then cut away the unneeded part of the lead frame 14, after which the metal foil leads 5 can be bent.

This embodiment of the present invention achieves the same type of effects as the fifth embodiment, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, and improve the ease of component mounting. Additionally, in the case this embodiment, because the metal foil leads 5 of the lead frame 14 are bend along the side surface of the LSI device 1, and the decoupling capacitors 2 are fixed thereonto, compared with the fifth embodiment there is a reduction in the amount of surface area occupied by the semiconductor device, thereby contributing to the reduction in the size of the circuit board 7. Additionally, when a lead frame 14 is used, the flatness and rigidity is superior the case of using a flexible substrate, thereby facilitating the task of making connections to the LSI device 1, and providing the advantage of maintain the shape with the leads themselves, after they are bent, as done in this embodiment.

An eighth embodiment of the present invention is described below, with references made to FIG. 21.

Figure 21A:
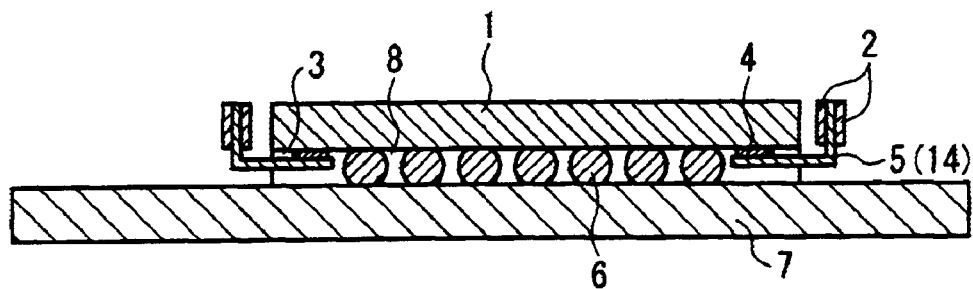
FIG. 21 is a cross-sectional view showing the condition of a semiconductor device according to a eighth embodiment of the present invention mounted to a circuit board.
Figure 21B:
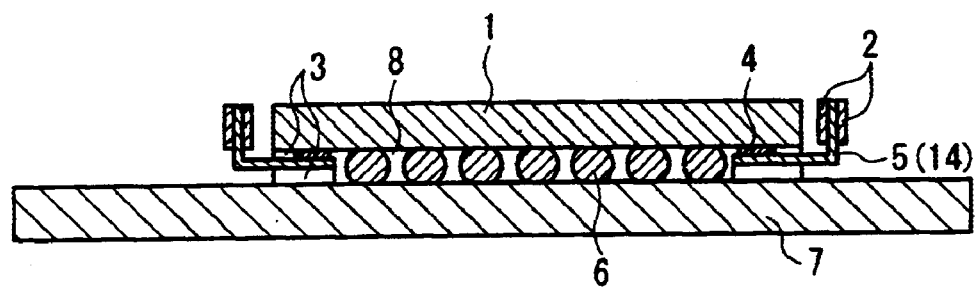

FIG. 21(a) and FIG. 21(b) show the condition in which a semiconductor device according to the eighth embodiment is mounted to a circuit board. A semiconductor device of this embodiment as well uses a lead frame, this being similar to the fifth to the seventh embodiments. In the case of the eighth embodiment, however, the metal foil leads are bent to the side surface of the LSI device, and decoupling capacitors are mounted to both surfaces thereof. Given this configuration, constituent elements in common with those shown in FIG. 14 to FIG. 18 are assigned the same reference numerals, and are not explicitly described herein.

In a semiconductor device of this embodiment, similar to that of the seventh embodiment, as shown in FIG. 21(a) and FIG. 21(b), the metal foil leads 5 are bent from the circuit-formation surface of the LSI device 1 along the side surface of the LSI device 1, and are bonded with heat to the circuit-formation surface of the LSI device 1. However, whereas in the seventh embodiment decoupling capacitors 2 are mounted only to outside side surface at which the metal foil leads 5 are bent, in the eighth embodiment the decoupling capacitors 2 are mounted not only to the outside surface of the metal foil leads 5, but also to the inside surface (surface facing the LSI device 1). In contrast to the case of using a flexible substrate 13, in using the lead frame 14, because the metal foil leads 5 are not in intimate contact with the LSI device 1 at the side surface, it is possible to adopt this type of configuration. Other features are the same as described with regard to the seventh embodiment. FIG. 21(a), similar to FIG. 20(a), shows the example in which the insulation layer 3 exists on only one side of the metal foil leads 5 at the peripheral edge part of the LSI device 1, with the underfill resin 8 injected at the other surface, while FIG. 21(b), similar to FIG. 20(b), shows the example in which the insulation layer 3 is provided on both sides of the metal foil leads 5 at the peripheral edge part of the LSI device 1.

The eighth embodiment of the present invention achieves the same type of effects as the seventh embodiment, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, improve the ease of component mounting, and reduce the surface area occupied by the semiconductor device, thereby reducing the size of the circuit board to which it is mounted. In addition, in the case of the eighth embodiment, because it is possible to mount double the number of decoupling capacitors 2 as in the seventh embodiment, it is possible to achieve a further reduction in the variation of the DC voltage supplied to the LSI device 1.

A ninth embodiment of the present invention is described below, with references made to FIG. 22.

Figure 22A:
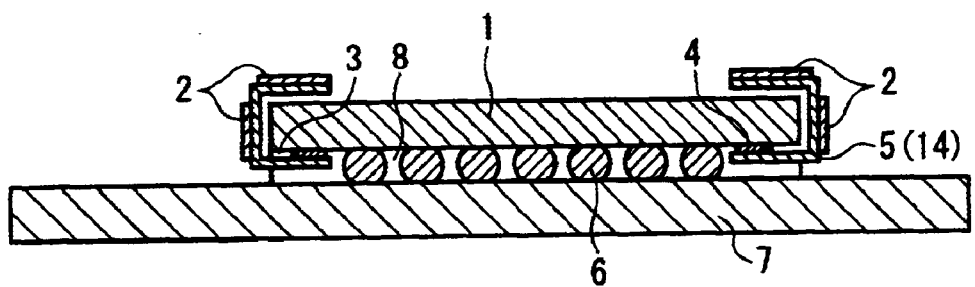
FIG. 22 is a cross-sectional view showing the condition of a semiconductor device according to a ninth embodiment of the present invention mounted to a circuit board.
Figure 22B:
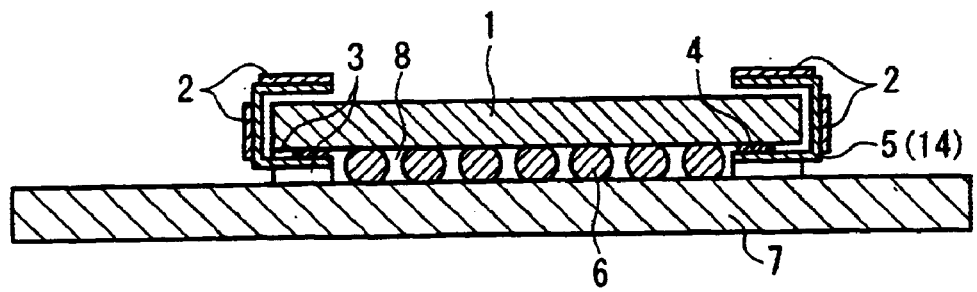

FIG. 22(a) and FIG. 22(b) are cross-sectional views showing the condition of a semiconductor device according to this embodiment mounted to a circuit board. The semiconductor device of this embodiment also uses a lead frame, and while other features thereof are the same as the same as the fifth to the eighth embodiments, this embodiment differs in that there is a further bending of the metal foil leads 5 to the rear side of the LSI device, with decoupling capacitors being mounted to that part. Given the similarity, however, constituent elements in common with those shown in FIG. 14 to FIG. 18 are assigned the same reference numerals and are not explicitly described herein.

In a semiconductor device according to this embodiment, as shown in FIG. 22(a) and FIG. 22(b), the metal foil leads 5 of the lead frame 14 are bent from the circuit-formation surface of the LSI device 1 to the side surface, and then further bent to the rear surface thereof, thermal bonding being done with an intervening insulation layer 3 at the circuit-formation surface part of the LSI device 1. Then, decoupling capacitors 2 are mounted to the metal foil leads 5 bent to the side and rear surfaces, using a conductive paste such as solder. Other features of this embodiment are the same as the seventh embodiment. FIG. 22(a), similar to FIG. 20(a), shows the example in which the insulation layer 3 is provided only on one side of the metal foil leads 5 at the peripheral edge part of the LSI device 1, with an underfill resin 8 injected at the other side, while FIG. 22(b), similar to FIG. 20(b), shows the example in which the insulation layer 3 is provided on both sides of the metal foil leads 5 at the peripheral edge part of the LSI device 1.

This embodiment of the present invention achieves the same type of effects as the seventh embodiment, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, and improve the ease of component mounting. In addition, by reducing the surface area occupied by the semiconductor device and mounting more decoupling capacitors 2 than in the seventh embodiment, the ninth embodiment provides a further reduction in the variation of the DC voltage supplied to the LSI device 1.

A tenth embodiment of the present invention is described below, with reference being made to FIG. 23.

Figure 23A:
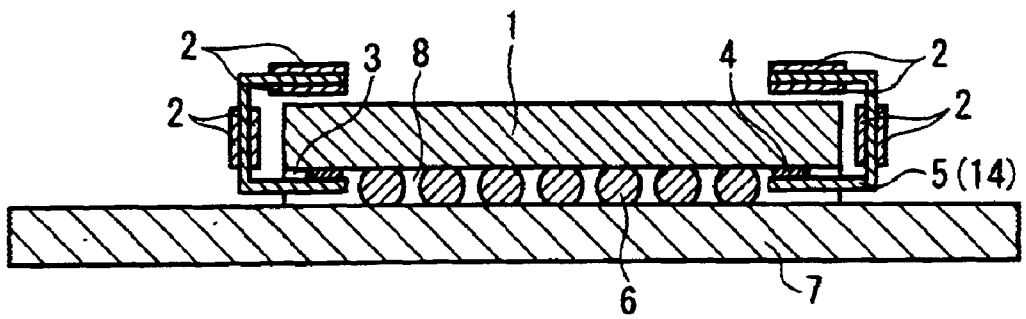
FIG. 23 is a cross-sectional view showing the condition of a semiconductor device according to a tenth embodiment of the present invention mounted to a circuit board.
Figure 23B:
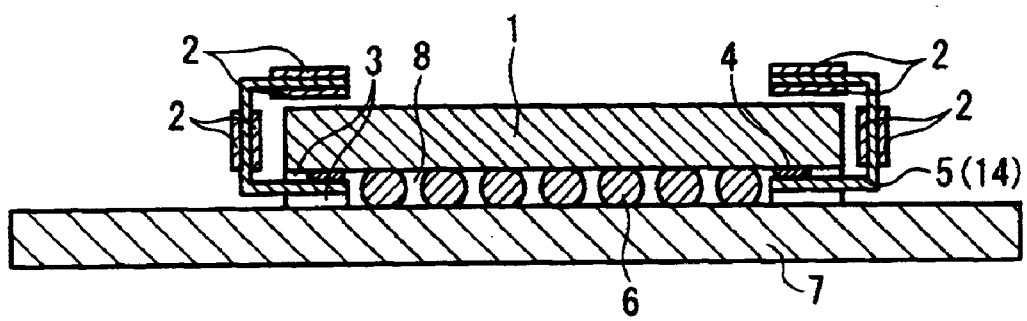
Figure 24:
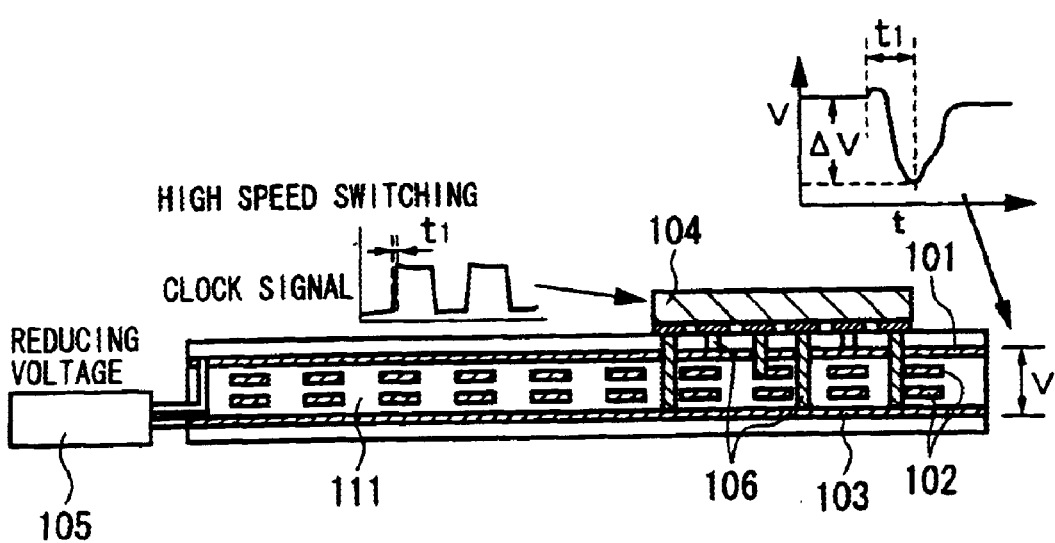
FIG. 24 is a cross-sectional view showing an example a structure for mounting a LSI device to a circuit board.
Figure 25:
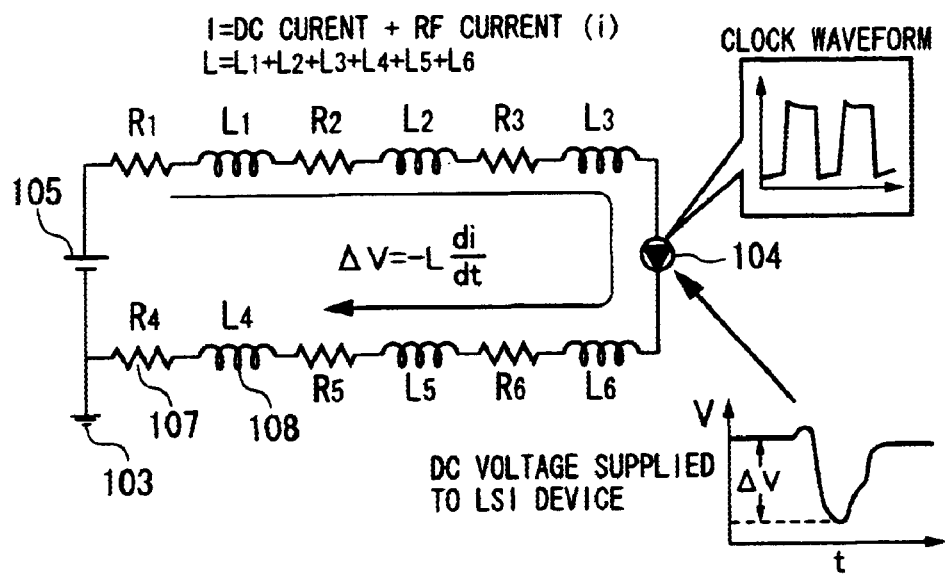
FIG. 25 is an equivalent circuit of the mounting structure of FIG. 24.
Figure 26:
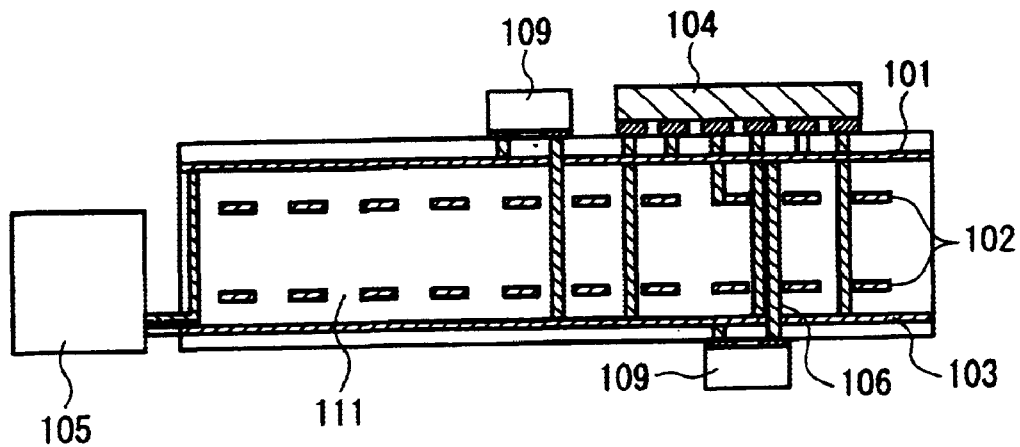
FIG. 26 is a cross-sectional view showing an example of a structure for mounting a LSI device and decoupling capacitors to a circuit board.
Figure 27:
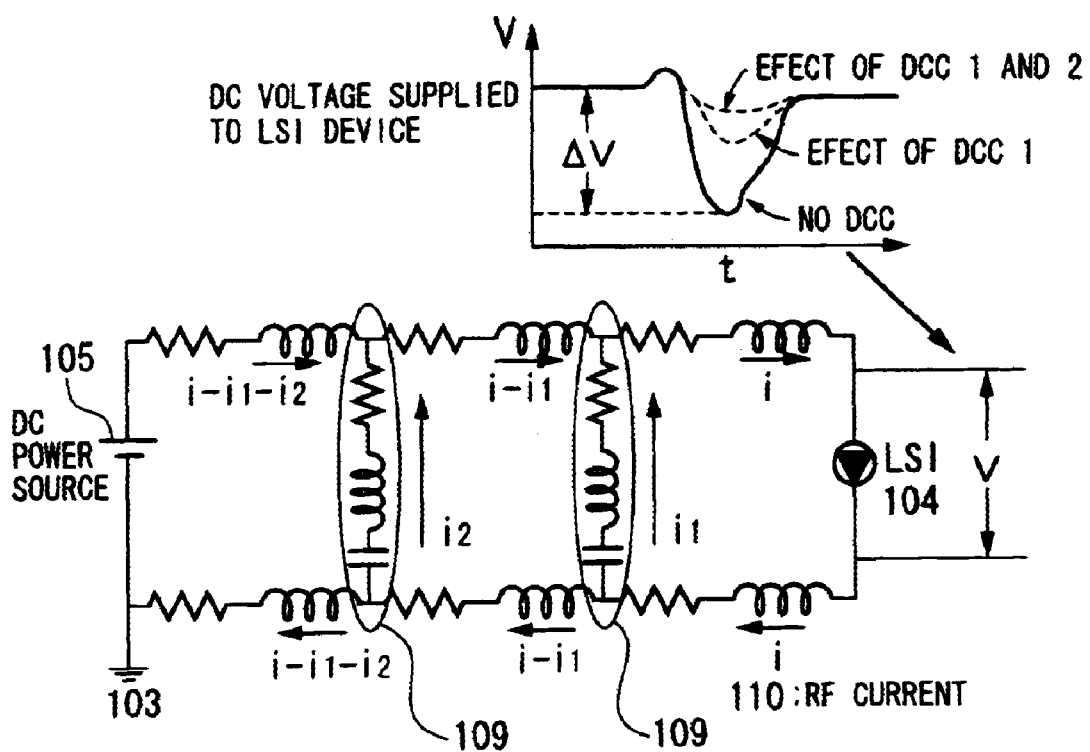
FIG. 27 is an equivalent circuit of the mounting structure of FIG. 26.

FIG. 23(a) and FIG. 23(b) are cross-sectional views showing the condition of a semiconductor device according to this embodiment mounted to a circuit board. The semiconductor device of this embodiment also uses a lead frame, and while other features thereof are the same as the same as the fifth to the ninth embodiments, this embodiment differs in that there is a further bending of the metal foil leads 5 to the rear side of the LSI device, with decoupling capacitors being mounted to both sides thereof. Given the similarity, however, constituent elements in FIG. 23 in common with those shown in FIG. 14 to FIG. 18 are assigned the same reference numerals and are not explicitly described herein.

While the ninth embodiment is described for the example in which the metal foil leads 5 are bent via the side surface of the LSI device 1 to the rear surface thereof, in that example decoupling capacitors are mounted only to the outside surface of the metal foil leads. In a semiconductor device according to this embodiment, as shown in FIG. 22(a) and FIG. 22(b), decoupling capacitors 2 are mounted not only to the outside surface of the metal foil leads 5, but also to the inside surface (facing the LSI device 1). Other features of the embodiment are the same as the ninth embodiment. FIG. 23(a), similar to FIG. 22(a), shows the example in which the insulation layer 3 is provided only on one side of the metal foil leads 5 at the peripheral edge part of the LSI device 1, with an underfill resin 8 injected at the other side, while FIG. 23(b), similar to FIG. 22(b), shows the example in which the insulation layer 3 is provided on both sides of the metal foil leads 5 at the peripheral edge part of the LSI device 1.

This embodiment of the present invention achieves the same type of effects as the ninth embodiment, in that, by enabling a shortening of the wiring length between the LSI device 1 and the decoupling capacitors 2, it can effectively suppress and compensate for a momentary drop in DC voltage, contribute to the reduction in size of a circuit board, raise the LC resonant frequency, and improve the ease of component mounting. In addition, similar to the case of the ninth embodiment, by reducing the surface area occupied by the semiconductor device and mounting more decoupling capacitors 2 than in the ninth embodiment, the tenth embodiment provides a further reduction in the variation of the DC voltage supplied to the LSI device 1.

The foregoing descriptions of embodiments of the present invention are presented as exemplary preferred embodiments thereof, and it will be understood that they do not restrict the present invention, it being further possible to implement the present invention is various other manners within the scope of the technical concept of the present invention. For example, in a configuration in which the metal foil leads are bent from the side surface to the rear surface, rather than mounting decoupling capacitors to the part of the metal foil leads in the parts thereof corresponding to the side of the LSI device 1, it is alternately possible, for example, to mount decoupling capacitors to parts of the metal foil leads corresponding to the rear surface of the LSI device 1. In this case, however, as described above if the distance from the electrode pads of the LSI device to the decoupling capacitors becomes great, there is an increase in the wiring inductance, thereby requiring that care be taken that the wiring does is not excessively extended in length.

Additionally, whereas the foregoing embodiments are described for the case in which the conductors making connections to the power supply line connection pads and the ground line connection pads of the LSI device are in the forms of a metal foil leads of a flexible substrate or metal foil leads of a lead frame, it will be understood that there is no restriction of the present invention to those configurations, and that it is possible to alternately various other forms. Additionally, the materials, dimensions, and shapes of various constituent elements and the arrangement of the electrode pads are merely exemplary, it being possible to make various changes to the actual details thereof as appropriate. Also, it is possible to apply the present invention to LSI devices of various forms.

According to the present invention as described in detail above, it is possible, without mounting capacitors to a circuit board, to shorten the length of wiring between a main semiconductor device and decoupling capacitors, thereby providing a sufficient reduction in the parasitic inductance of the wiring paths. As a result, the decoupling capacitors function sufficiently, and it is possible to suppress or compensate for a momentary drop in the DC voltage. Additionally, it is possible to achieve savings in space by mounting capacitors onto conductors of the semiconductor device, thereby contributing to a reduction in the size of a circuit board to which the semiconductor device is mounted.

What is claimed is:

1. A semiconductor device comprising: a main semiconductor device having on a circuit-formation surface a plurality of power simply line connection pads and a plurality of ground line connection pads, conductors each of which is electrically connected to either one of said power supply line connection pads or one of said wound line connection pads, respectively, and capacitors electrically connected to at least one surface of said conductors, wherein a flexible substrate comprising metal foil leads, each of said metal foil leads serving as one of said conductors and an insulation layer provided at least on a surface of each of said metal foil leads, said surface of each of said metal foil leads opposing to said main semiconductor device, is joined to said circuit-formation surface of said main semiconductor device.

2. A semiconductor device according to claim 1, wherein said insulation layer comprises a thermoplastic adhesive.

3. A semiconductor device according to claim 1, wherein said metal foil leads are formed on only a peripheral edge part of said circuit-formation surface of said main semiconductor device, a plurality of holes are provided on said insulation layer provided in a region formed on said circuit-formation surface of said main semiconductor device, and in said region, no metal foil lead is provided, and at positions corresponding to said plurality of pads of said main semiconductor device, and a plurality of bumps of said main semiconductor device are caused to pass though each of said plurality of holes, thereby making joints to each of said plurality of pads.

4. A method for mounting a semiconductor device according to claim 3, comprising the steps of:

fabricating a main semiconductor device in which said power supply line connection pads and said ground line connection pads are alternately placed on and along a peripheral edge of said circuit-formation surface of a main semiconductor device, and in which bumps are formed over pads in regions other than said peripheral edge part of said circuit-formation surface;

fabricating a flexible substrate joining a capacitor between two neighboring metal foil leads;

fabricating said semiconductor device by making electrical connections between said power supply line connection pads and said ground line connection pads both being formed at a peripheral edge part of said main semiconductor device and said metal foil leads of said flexible substrate; and mounting said semiconductor device onto said circuit board by placing said semiconductor device on said circuit board and heating it, so as to cause said bumps of said main semiconductor device to reflow.

5. A method for mounting a semiconductor device to a circuit board according to claim 4, whereby after mounting said semiconductor device to said circuit board, a resin is injected between a space between said semiconductor device and said circuit board.

6. A semiconductor device comprising:

a main semiconductor device having on a circuit-formation surface a plurality of power supply line connection pads and a plurality of ground line connection pads, conductors each of which is electrically connected to either one of said power supply connection pads or one of said ground line connection pads, respectively; and capacitors electrically connected to at least one surface of said conductors; and a flexible substrate comprising metal foil leads serving as said conductors and an insulation layer provided at least on a surface of said metal foil lead, said surface opposing said main semiconductor device, being joined to a circuit-formation surface of said main semiconductor device.

7. A semiconductor device according to claim 1, wherein said conductor is a lead.

8. A semiconductor device according to claim 1, wherein a plurality of first conductors are electrically connected to said power supply connection pads and a plurality of second conductors are electrically connected to said ground line connection pads; and further wherein, said capacitors are electrically connected to one surface of said first conductor and connected to one surface of said second conductor.

9. A semiconductor device according to claim 6, wherein said capacitors function as decoupling capacitors suppressing or compensating for a momentary drop in a DC voltage supplied to said main semiconductor device.

10. A semiconductor device according to claim 6, wherein said power supply line connection pads and said ground line connection pads are alternately disposed along an edge extension direction of a peripheral edge of said circuit-formation surface of said main semiconductor device, and that said capacitor is connected between two neighboring conductors each connected respectively to a power supply line connection pad and a ground line connection pad.

11. A semiconductor device according to claim 6, wherein either one of said power supply line connection pads or one of said ground line connection pads are connected to said conductor by a bump made of solder or gold.

12. A semiconductor device according to claim 6, wherein said insulation layer comprises a thermoplastic adhesive.

13. A semiconductor device according to claim 6, wherein said metal foil leads are formed on only a peripheral edge part of said circuit-formation surface of said main semiconductor device, a plurality of holes are provided on said insulation layer provided in a region formed on said circuit-formation surface of said main semiconductor device, and in said region, no metal foil lead is provided, and at positions corresponding to said plurality of pads of said main semiconductor device, and a plurality of bumps of said main semiconductor device are caused to pass through each of said plurality of holes, thereby making joints to each of said plurality of pads.

14. A semiconductor device according to claim 8, wherein said capacitors function as decoupling capacitors suppressing or compensating for a momentary drop in a DC voltage supplied to said main semiconductor device.

15. A semiconductor device according to claim 8, wherein said power supply line connection pads and said ground line connection pads are alternately disposed along an edge extension direction of a peripheral edge of said circuit-formation surface of said main semiconductor device, and that said capacitor be provided connected between two neighboring conductors each connected respectively to a power supply line connection pad and a ground line connection pad.

16. A semiconductor device according to claim 8, wherein either one of said power supply line connection pads or one of said ground line connection pads are connected to said conductor by a bump made of solder or gold.

17. A semiconductor device according to claim 8, wherein a flexible substrate comprising a metal foil lead serving as a conductor and an insulation layer provided at least on a surface of said metal foil lead, said surface opposing said main semiconductor device, is joined to a circuit-formation surface of said main semiconductor device.

18. A semiconductor device according to claim 8, wherein said insulation layer comprises a thermoplastic adhesive.

19. A semiconductor device according to claim 8, wherein said metal foil leads are formed on only a peripheral edge part of said circuit-formation surface of said main semiconductor device, a plurality of holes are provided on said insulation layer provided in a region formed on said circuit-formation surface of said main semiconductor device, and in said region, no metal foil lead is provided, and at positions corresponding to said plurality of pads of said main semiconductor device, and a plurality of bumps of said main semiconductor device are caused to pass through each of said plurality of holes, thereby making joints to each of said plurality of pads.

* * * * *